United States Patent
Matsumura et al.

(10) Patent No.: US 6,593,548 B2
(45) Date of Patent: Jul. 15, 2003

(54) HEATING ELEMENT CVD SYSTEM

(75) Inventors: Hideki Matsumura, Ishikawa (JP); Atsushi Masuda, Ishikawa (JP); Keiji Ishibashi, Tokyo (JP); Masahiko Tanaka, Tokyo (JP); Minoru Karasawa, Tokyo (JP)

(73) Assignees: Japan as represented by President of Japan Advanced Institute of Science and Technology, Ishikawa (JP); Anelva Corporation, Tokyo (JP)

(*) Notice: Subject to any disclaimer, the term of this patent is extended or adjusted under 35 U.S.C. 154(b) by 0 days.

(21) Appl. No.: 10/130,207

(22) PCT Filed: Sep. 7, 2001

(86) PCT No.: PCT/JP01/07795

§ 371 (c)(1),
(2), (4) Date: May 14, 2002

(87) PCT Pub. No.: WO02/25712

PCT Pub. Date: Mar. 28, 2002

(65) Prior Publication Data

US 2002/0189545 A1 Dec. 19, 2002

(30) Foreign Application Priority Data

Sep. 14, 2000 (JP) ........................................ 2000-280375
Mar. 23, 2001 (JP) ........................................ 2001-85326

(51) Int. Cl.$^7$ ................................................. F27B 5/14
(52) U.S. Cl. ...................... 219/390; 219/409; 219/541; 118/725; 118/728
(58) Field of Search ................................ 219/390, 405, 219/411, 409, 541; 118/724, 725, 728, 50.1; 392/416, 418

(56) References Cited

U.S. PATENT DOCUMENTS 4,223,048 A * 9/1980 Engle, Jr. .................... 427/39
5,755,886 A * 5/1998 Wang et al. ................. 118/715
6,069,094 A   5/2000 Matsumura
6,132,514 A * 10/2000 Srinivasan et al. .......... 118/715
6,325,857 B1 * 12/2001 Miyoshi ....................... 118/724

FOREIGN PATENT DOCUMENTS

| JP | 10-83988 | 3/1989 |
| JP | 1-162769 | 6/1989 |
| JP | 8-115882 | 5/1996 |
| JP | 8-218172 | 8/1996 |
| JP | 8-250438 | 9/1996 |
| KR | 98024396 | 7/1998 |
| TW | 344099 | 11/1998 |

* cited by examiner

*Primary Examiner*—Teresa Walberg
*Assistant Examiner*—Shawntina Fuqua
(74) *Attorney, Agent, or Firm*—Wenderoth, Lind & Ponack, L.L.P.

(57) ABSTRACT

A heating element CVD device capable of providing a high productivity and decomposing and/or activating the material gas led into a processing container by a heating element and stacking film on a substrate disposed in the processing container, wherein the connection part area of the heating element to a connection terminal for connecting the hearing element to a power supply mechanism is not exposed to a space inside the processing container, specifically, the connection part area is covered by a cylindrical body or a platy body covering the connection part area while providing a space part thereof from the hearing element, or the connection part area allows the space part to be present in a space thereof from the connection terminal and is covered by the cylindrical body or platy body covering the connection part area while providing the space part in a space thereof from the heating element, and hydrogen gas is led from the connection terminal side into the processing container through the space part, whereby the portion of the heating element near the connection part to the power supply mechanism can be prevented from being deteriorated by the material gas, the material gas can be prevented from reacting with cleaning gas during the cleaning for removing the film adhered to the inside of the processing container, the service life of the heating element can be increased, and a film forming environment can be stabilized.

19 Claims, 9 Drawing Sheets

HEATING ELEMENT CVD SYSTEM

TECHNICAL FIELD

The present invention relates to a heating element CVD system in which a heating element kept at a specified temperature is disposed in a vacuum chamber (processing container) and in which a raw material gas is decomposed and/or activated by the said heating element to deposit a thin film on a substrate placed in the vacuum chamber (processing container).

BACKGROUND ART

In manufacturing various kinds of semiconductor devices including a LSI (large scale integrated circuit), a LCD (liquid crystal display) and the like, a CVD (chemical vapor deposition) method has been widely used as one process for forming a predetermined thin film on a substrate In CVD method, there are several methods, that is, a plasma CVD method in which a raw material gas is decomposed and/or activated in discharged plasma to form a thin film, a thermal CVD method in which a substrate is heated to induce a chemical reaction to form a thin film and so on. In addition, a CVD method in which a raw material gas is decomposed and/or activated by a heating element kept at a predetermined high temperature to form a thin film (hereinafter referred to as a heating element CVD method).

In a film forming system for performing the heating element CVD method (hereinafter referred to as a heating element CVD system), a heating element made of a refractory metal such as tungsten or the like is disposed in a processing chamber. The processing chamber is capable of being evacuated to a vacuum. A raw material gas is introduced into the evacuated processing chamber while the heating element is kept at high temperatures from about 1000° C. to 2000° C.

The introduced raw material gas is decomposed and/or activated when it passes over the surface of the heating element and reaches a substrate to deposit a thin film of the material, which is a final objective material, on the surface of the substrate. In the heating element CVD methods, a CVD method using a wire-shaped heating element is called as a Hot Wire CVD method, and a CVD method utilizing the catalytic reaction of a heating element for decomposing and/or activating the raw material gas is called as a catalytic CVD (or Cat-CVD) method.

In the heating element CVD method, the raw material gas is decomposed and/or activated when it passes over the surface of the heating element. For this reason, this method has an advantage of reducing the temperature of the substrate as compared with the thermal CVD method in which reaction is induced only by the heat of the substrate. Further, in the heating element CVD method, plasma is not produced, as it is produced in the plasma CVD method. For this reason, there is no worry that plasma causes damage to the substrate. Accordingly, the heating element CVD method is thought to be a promising candidate as a film forming method for a semiconductor device, a display device and the like of the next generation in which high integration and high functionality have been increasingly required.

FIG. 10 shows conceptional view of a conventional heating element CVD system. In a processing container 1, a predetermined processing of forming a thin film is performed to a substrate (not shown). An evacuation system 11 for evacuating the processing container 1 to a vacuum and a raw material gas supply system 21 for supplying a raw material gas into the processing container 1 for forming a thin film are connected to the processing container 1.

In the processing container 1, a heating element 3 is disposed such that the raw material gas supplied into the processing container 1 passes over the surface of it. A power supply mechanism 30 for supplying electric power is connected to the heating element 3, thereby the heating element 3 is heated and kept at a predetermined temperature (a high temperature of about from 1600° C. to 2000° C.) required for the heating element CVD method. Further, in the processing container 1, a gas supply unit 2 and the heating element 3 are arranged facing each other.

Further, in the processing container 1, a predetermined thin film is formed on the substrate (not shown) by the raw material gas decomposed and/or activated by the heating element 3 that is kept at the predetermined high temperature described above. For this reason, in the processing container 1, a substrate holder 4 is provided for holding the above-mentioned substrate (not shown).

In FIG. 10, it is a gate valve for carrying the substrate into or out of the processing container 1 that is denoted by a reference character 5. Further, the substrate holder 4 is provided with, as is conventionally known, a heating mechanism for heating the substrate, but this heating mechanism will not be shown or described because it is not important in the present invention.

In the embodiment shown in FIG. 10, although it is not shown, the raw material gas supply system 21 includes a cylinder filled with the raw material gas, a supply pressure regulator, a flow regulator, a supply/stop switching valve, and the like. The raw material gas is supplied by the raw material gas supply system 21 into the processing container 1 via the gas supply unit 2 provided in the processing container 1.

Further, in a process using two or more kinds of raw material gases, the raw material gas supply systems 21 of the number equal to the number of kinds of gases used are connected in parallel to the gas supply unit 2.

The gas supply unit 2, as described above, is arranged in face with the heating element 3 in the processing container 1. Further, the gas supply unit 2 has a hollow structure and many gas blowing holes 210 on a surface facing the substrate holder 4.

On the other hand, the evacuation system 11 is connected to the processing container 1 via a main valve 12 having an evacuation speed regulating function. The pressure of the processing container 1 is controlled by this evacuation speed regulating function.

In the heating element CVD method, the substrate (not shown) is a substance to be subjected to a predetermined processing of forming a thin film. This substrate (not shown) is carried in and out of the processing container 1 via the gate valve 5. And a heating mechanism (not shown) for heating the substrate (not shown) to a predetermined temperature is built in the substrate holder 4.

The heating element 3 is generally formed of a wire-shaped member and is bent in the shape of sawteeth and is held by a support body 31, the surface of which is at least made of insulator. Further, a power supply line 32 from the power supply mechanism 30 is connected to the heating element 3 by a connection terminal 33. An electric power is supplied to the heating element 3 via this connection terminal 33 to heat the heating element 3 to the predetermined temperature required for the heating element CVD method and to keep it at the predetermined temperature.

Usually, a direct current power source or an alternating current power source is used as the power supply mechanism 30. The heating element 3 is supplied with electric power from the power source and is set at the predetermined temperature by the passage of the electric current. By heating the heating element 3 to a high temperature, the raw material gas is decomposed and/or activated to effectively form a thin film.

Usually, the heating element 3 is heated to a predetermined temperature (usually, at a film forming process, a high temperature of from about 1600° C. to 2000° C.) by the passage of the electric current, so a refractory metal is used as the material for the heating element 3 and, in general, tungsten is used.

A case where a silicon film is formed and a case where silicon nitride film is formed are explained as examples of forming a thin film by the heating element CVD system shown in FIG. 10. The processes are proceeded as follows.

First, a mixed gas of silane ($SiH_4$) and hydrogen ($H_2$) is used in the case where the silicon film is formed. A mixed gas of silane and ammonia ($NH_3$) is used in the case where the silicon nitride film is formed. The pressure in the processing container 1 is about from 0.1 Pa to 100 Pa. In both cases, the temperature of the heating element 3 is set at a predetermined temperature (usually, a high temperature of about from 1600° C. to 2000° C. at a film forming process), and the temperature of the substrate (not shown) held by the substrate holder 4 is set at a temperature of about from 200° C. to 500° C. by a heating mechanism (not shown) in the substrate holder 4.

In the case where the silicon film or the silicon nitride film is formed under predetermined film forming conditions by the use of a conventional heating element CVD system described above, the following phenomenon is produced. A refractory metal used for the heating element, for example, a tungsten wire described above or the like sometimes reacts with the silane gas to form a silicon compound (hereinafter referred to silicidation).

A silicidation mentioned above proceeds from near a connection terminal 33 that is the connection part by which electric power is supplied from the power supply mechanism 30 (that is, the connection region of the heating element 3). In the said connection region of the heating element 3, the temperature becomes lower than 1600° C. even at the film forming process. Further, in the said connection region of the heating element 3, the reaction speed of the raw material gas with the heating element 3 is faster than the desorption speed of decomposed and/or activated gas species of the raw material gas and raw material gas itself.

The above-mentioned silicidateion changes the composition and diameter of the heating element 3 and reduces the resistance thereof. As a result, the heating power is reduced and the whole heating element is finally deteriorated. Also, it reduces a film forming speed as hours of use of the heating element is elongated. Further, since the products of the silicide and the like have high vapor pressures in general, they contaminate the deposited film and degrade the quality of the silicon film formed or the silicon nitride film formed as the deterioration of heating element is proceeding.

Therefore, it is necessary to break the vacuum in the processing container 1 to the atmospheric pressure and to change the heating element 3 when a predetermined number of substrates are processed. This change of the heating element 3 results in a problem in productivity.

As to this silicidation phenomenon, A. H. Mahan et al. made a presentation of a detailed paper entitled "The influence of W filament alloying on the electronic properties of HWCVD deposited a-Si:H films" in Materials Research Society 2000 Spring Meeting held at Marriott Hotel and Argent Hotel in San Francisco in the U.S.A. from Apr. 24 to 28, 2000.

As to means for controlling the deterioration caused by the silicidation of the heating element, Mahan et al. proposed means for elongating the life of the heating element in the paper, that is, heating the heating element in a hydrogen gas or in a vacuum after forming a film.

However, this means needs to secure a time for performing the processing between the formations of the respective films and hence results in a problem of reducing productivity. Further, to be exact, the silicidation of the heating element proceeds while the film is being formed, that is, the temperature of the heating element or a film forming environment around the heating element 3 such as the effective region of the heating element 3 for the decomposition and/or activation of the raw material gas and the like is changed while the film is being formed. For this reason, the characteristics of the film is changed (degraded) in the direction of thickness in the case when the film forming time is long.

FIG. 11 is a view to show a part of a support body 31 of a conventional embodiment. In the part of a support body 31 of the conventional embodiment, the heating element 3 is supported by the support body 31 by means of a wire 34 (usually, made of molybdenum) to reduce a contact area of the heating element 3 thereby reducing thermal conduction. The conventional embodiment shown in FIG. 11 is intending to prevent silicidation, which proceeds from the portion of the heating element 3 where its temperature is slightly low.

However, even in this method, the temperature of the heating element 3 at the portion in contact with the wire 34 drops inevitably, so that the silicidation at and from the said portion is caused, depending on film forming conditions such as a high silane gas pressure in case of forming the silicon film or the like.

Further, even in this method, it is impossible to eliminate connection to the power supply line 32, so that the silicidation is also caused at the portion of the connection terminal 33 as is the case shown in FIG. 10.

Therefore, even in a heating element CVD system adopting the constitution shown in FIG. 11, it is necessary to break the vacuum in the processing container 1 to the atmospheric pressure and to change the heating element 3 when a predetermined number of substrates are processed. The change of the heating element 3 results in a problem in productivity.

By the way, if films are repeatedly formed in the heating element CVD system, the films are deposited on the inside of the processing container and are peeled off and results in the cause of the particulate problem. The inventors of the present application proposed a method of effectively removing a film deposited on the inside of a processing container, which become an origin of particulates, and an in situ cleaning method of a heating element CVD system (Japanese Patent Application Laid-Open (JP-A) No. 2001-49436).

According to this method, a gas supply unit 2 of a conventional heating element CVD system shown in FIG. 10 is provided with a cleaning gas supply system having the same constitution as a raw material gas supply system 21, and when cleaning the system, instead of a raw material gas used in forming a film, a cleaning gas is introduced into a processing container 1 via the gas supply unit 2. That is, this is an invention characterized in that after the processing container 1 is evacuated, a heating element 3 disposed in the processing container 1 is heated to and kept at a temperature of 2000° C. or more, and that a cleaning gas which is decomposed and or activated by the heated body 3 to produce activated species which in turn react with a deposited film to change it into a gaseous substance is introduced into the processing container 1, and that the produced gaseous substance is exhausted from the processing container 1 to remove the deposited film from the inside surface of processing chamber. This invention has been made based on findings that when the heating element 3 is kept at a temperature of 2000° C. or more, the heating element 3 itself does not react with the cleaning gas but remains stable.

However, after the above-mentioned invention was made, it turned out that even if it was tried to keep the heating element 3 at a temperature of 2000° C. or more, a part near the connection terminal 33, which is the connection part of power supply from a power supply mechanism 30 to the heating element 3, was low in temperature, and that the said part was etched by the cleaning gas and was gradually reduced in diameter and finally broken by the reaction of the said part with the cleaning gas. Thus, it is necessary to replace the heating element at a certain time, which results in a problem in productivity.

Further, it was found that in the case where a film was deposited on a large-area substrate of over 1 m by the use of a heating element CVD system shown in FIG. 10 and FIG. 11, there was a room for improvement in the uniformity of thickness of a thin film deposited.

In the Cat-CVD method, in the case where in order to form a film on a large-area substrate by the use of the heating element CVD system shown in FIG. 10 and FIG. 11, a conventional technique is adopted in which a sawtooth heating element 3 is supported by a large size support frame as large as a substrate, there is presented a problem that the heating element 3 is drooped by thermal expansion. That is, since the sawtooth heating element 3 is thermally expanded by about 1% when it is heated to 1800° C., if a heating element 3 having a length of 1 m is used to form a film on a large-area substrate, the heating element 3 is drooped by 70 mm at the maximum by a thermal expansion of 1%. In the worst case, it is estimated that the heating element 3 is drooped more than the distance between the substrate and the heating element 3, which is usually set at about 50 mm. According to the inventor's study, it is verified that the gap (distance) between the heated heating element 3 and the substrate subjected to a film forming process greatly affects the uniformity of a film thickness when the film is formed.

At present, it is prospected that the size of a next-generation glass substrate is larger than 1 m. For example, it is planned to use a large substrate of 1100 mm×1250 mm for a LCD and 1000 mm×400 mm for a solar cell. In order to form a film on such a large-area substrate, it is necessary to reduce the degree of drooping of the heating element 3 caused by the thermal expansion mentioned above and to ensure the uniformity of thickness of the film formed on the large-area substrate, so that the heating element CVD system shown in FIG. 10 and FIG. 11 has a room for improvement.

DISCLOSURE OF THE INVENTION

In a heating element CVD system in which a raw material gas introduced into a processing container (vacuum chamber) is decomposed and/or activated by a heating element to deposit a thin film on a substrate placed in the processing container (vacuum chamber), the objects of the present invention are as follows: one object is to prevent the connection region of the heating element connected to a power supply mechanism from being degraded by the raw material gas; and another object is to prevent the connection region of the heating element connected to a power supply mechanism from reacting with a cleaning gas when a cleaning process for removing a film deposited on the inside of the processing container is proceeded.

By countermeasures mentioned above, it is the object of the present invention to provide a heating element CVD system having high productivity that can elongate the life of the heating element and realize a stable film forming environment.

Further, it is the object of the present invention to provide a heating element CVD system that can meet with a film forming on a large-area substrate having a size of im or more and can ensure a uniform film thickness even if the film is formed on such a large-area substrate.

A heating element CVD system of the present invention is constituted as follows in order to accomplish the above objects.

A heating element CVD system of the present invention is provided with a processing container in which a predetermined processing is performed to a substrate held by a substrate holder disposed therein, an evacuation system which is connected to the said processing container and evacuates it to a vacuum, a raw material gas supply system for supplying a predetermined raw material gas into the said processing container, and a heating element which is disposed in the said processing container and is supplied with electric power from a power supply mechanism and is thereby heated to high temperatures (about from 1600° C. to 2000° C. when a film is formed and about 2000° C. to 2500° C. when a cleaning process is performed). And the heating element CVD system of the present invention relates to a heating element CVD system in which the raw material gas introduced into the processing container from the raw material gas supply system is decomposed and/or activated by the heating element kept at the high temperatures to deposit a thin film on the substrate held by the substrate holder, In this connection, the predetermined processing described above means, for example, depositing a thin film on the substrate to be processed, which is placed in the processing container, and a cleaning or removing the substance deposited on the inside of the processing container. Further, the predetermined raw material gas is determined variously according to the thin film to be deposited and, for example, in the case of depositing a silicon film, a mixed gas of silane ($SiH_4$) and hydrogen ($H_2$) is used as the predetermined raw material gas described above, and in the case of depositing a silicon nitride film, a mixed gas of silane and an ammonia ($NH_3$) is used as the predetermined raw material gas described above.

The heating element CVD system of the present invention is characterized in that, in the configuration as the before described, one or a plurality of connection terminal holders is placed in the processing chamber. Each of the said connection terminal holders holds a plurality of connection terminals at a predetermined position with electrically insulating therebetween. Each of the said connection terminals connects the heating elements to the power supply mechanism electrically. The said heating elements connected to the connection terminals are supported in face with the substrate holder. And, in that, a connection regions of the heating elements connected to the said connection terminals are not exposed to a space in the processing container.

Each connection terminal holder in the above-described heating element CVD system of the present invention is a structure that is independent of the processing container and can be removed from the processing container. Further, each connection terminal holder is connected to the power supply mechanism, the raw material gas supply system, and a gas introduction system which will be described later, respectively In the case where a substrate to be processed is not particularly large in size, it is good enough to place one connection terminal holder in the processing container, but in the case where a substrate to be processed has a large area of 1 m or more, it is possible to cope with such a large-area substrate by increasing the number of connection terminal holders to be placed in the processing container. That is, even if the substrate to be processed has a large area of 1 m or more, it is possible to eliminate the need for manufacturing a single connection terminal holder that is equal to or larger than the area of the substrate to be processed. On the contrary, it is possible to circumvent such restriction on the arrangement of the heating element that is restricted according to the shape and size of a supporting body in the conventional art. Further, it is possible to arrange the heating element at any position of the connection terminal holder and to make a wire shaped heating element suitable length, in each connection terminal holder. For this reason, it is possible to reduce the degree of drooping of the heating element caused by thermal expansion.

In the above description, one or a plurality of connection terminal holders is placed in the processing chamber. Each of the said connection terminal holders holds a plurality of connection terminals at a predetermined position with electrically insulating therebetween. Each of the said connection terminals connects the heating elements to the power supply mechanism electrically. The said heating elements connected to the connection terminals are supported in face with the substrate holder. By the use of the said connection terminal holder, it is possible to arrange the heating elements adequately at more preferable position, and thus to form a thin film having a uniform film thickness.

In particular, even in the case where a plurality of connection terminal holders are disposed to form a thin film on a large-area substrate having a size of 1 m or more, it is possible to form the thin film having a uniform film thickness on the large-area substrate. This is because it is possible to suitably arrange the heating elements at a more preferable positions in accordance with an area of substrate to be processed, process condition, or the like in order to improve the uniformity of the thin film at the boundary region between the neighboring connection terminal holders and at the peripheral portion of the large-area substrate.

Further, even in the case where a film is formed on the large-area substrate having a size of 1 m or more, it is only necessary to dispose a plurality of connection terminal holders each of which is an independent structure, as described above. For this reason, it is possible to manufacture one connection terminal holder at low cost in such a size as improves workability and is easy to machine. Even if a substrate on which a film is formed is large in size, it is possible to easily form the film on such large-area substrate by arranging the plurality of connection terminal holders. Further, it is possible to improve the work efficiency of maintenance such as dismounting or mounting the connection terminal holders for repair in the processing container.

Next, in the heating element CVD system of the present invention, as described above, the connection region of the heating element connected to the connection terminal to connect the heating element to the power supply mechanism electrically is not exposed to the space in the processing container. Thus, it is possible to prevent the raw material gas such as silane or the like from contacting a region of the heating element where temperature is slightly low (the connection region of the heating element connected to the connection terminal) This can prevent the region of the heating element where temperature is slightly low from being degraded (changed to a silicide) by the raw material gas when the film is formed.

The structure for preventing the connection region of the heating element to the connection terminal from being exposed to the space in the processing container can be realized, for example, by the preferred embodiment described in the following.

In the first preferred embodiment, the connection region of the heating element to the connection terminal is covered with a cylindrical body or a plate which is made of an insulating substance, a metal, or a composite of these materials and covers the said connection region with a gap between the cylindrical body or the plate and the heating element.

In the second preferred embodiment, the connection region of the heating element to the connection terminal is covered with a cylindrical body or a plate that is made of an insulating substance, a metal, or a composite of these materials and covers the connection region with a connection terminal inside hollow portion between the cylindrical body or the plate and the connection terminal and with a gap between the cylindrical body or the plate and the heating element.

In the third preferred embodiment, the connection terminal is constituted by a connection terminal body and a cap put on the said connection terminal body with a gap between itself and the heating element, and a connection terminal inside hollow portion is formed between the cap and the connection terminal body.

In any one of the preferred embodiments described above, it is possible to prevent the connection region of the heating element to the connection terminal from being exposed to the space in the processing container. Thereby, it is possible to prevent the connection region of the heating element (that is, the part of the heating element where temperature is slightly low) from contacting the raw material gas or the activated species originated from the raw material gas when the film is formed and from contacting a cleaning gas when a cleaning process is performed.

In this connection, in place of the cylindrical body, it is also possible to use a plate having a hole corresponding to the hollow portion of the cylindrical body and a thickness corresponding to the length of the cylindrical body. And, it is possible to produce the same working and effect by using the said plate with covering the connection region of the heating element connected to the connection terminal and without contacting the heating element.

In the before described structure, as the hole of the cylindrical body or the plate is smaller in inside diameter and longer in length, the connection region of the heating element can be prevented more effectively from being exposed to the space in the processing container. That is, it is preferable from the viewpoint of preventing the connection region of the heating element from contacting the raw material gas when the film is formed that the hole of the cylindrical body or the plate is smaller in inside diameter and longer in length. Hence, in consideration of manufacturing accuracy and manufacturing cost, for example, in the case where a tungsten wire of 0.5 mm in diameter is used as a heating element, it is preferable that the inside diameter of the cylindrical body or the plate is about from 0.7 mm to 3.5 mm and the length thereof is about from 10 mm to 50 mm.

The above-described cylindrical body or plate is heated at a high temperature by the radiation from the heating element. Hence, it is desired that the above-described cylindrical body or plate is formed of a material having as low a vapor pressure as possible, for example, a refractory metal such as tantalum, molybdenum or aluminum. Further, it is thought that the above-described cylindrical body or plate is made of a metallic material and is directly attached to a member (for example, a plate) for holding a member to which the heating element is connected (for example, the connection terminal body or the like). In this case, there is a possibility that the said plate, etc. is put into contact with the heating element by thermal strain and the like so as to develop an electric short circuit. Hence, to prevent such electric short circuit, it is desirable that the above-described cylindrical body or plate is formed of a composite material covered with an insulating material such as aluminum or the like.

Further, it is possible to cover the connection region of the heating element to the connection terminal in the form without contacting with the said connection region. That is, the connection region of the heating element to the connection terminal is covered with the above-described cylindrical body or plate with a gap between the above-described cylindrical body or plate and the connection terminal and with a gap between the above-described cylindrical body or plate and the heating element. In this manner, it is possible to adopt a structure in which the connection region of the heating element to the connection terminal is not exposed to the space in the processing container and in which a purge gas is flowed through the gap described above from the connection terminal to the processing container.

Thereby, it is possible to further effectively prevent the connection region of the heating element where temperature is slightly low when the film is formed from being degraded (changed to a silicide) by the raw material gas. Further, when the deposited film is removed (a cleaning process is performed), it is possible to further effectively prevent the part of the heating element (connection region of the heating element) where temperature is slightly low from contacting and reacting with (being etched by) the cleaning gas.

This can be realized by adopting the following embodiment.

For example, each connection terminal holder has the first inside hollow portion, and the connection region of the heating element connected to each of a plurality of connection terminals held at a predetermined position of the connection terminal holder in an electrically insulated state is covered with a cylindrical body or a plate made of an insulating material or a metal or a composite material of these materials, which covers the said connection region of the heating element with the connection terminal inside hollow portion between the cylindrical body or the plate and the connection terminal and with a gas passing hole between the cylindrical body or the plate and the heating element, and the connection terminal inside hollow portion communicates with the said first inside hollow portion to which a gas supply introduction system for introducing gas is connected.

Alternatively, each connection terminal holder has the first inside hollow portion, and each of a plurality of connection terminals held at a predetermined position of the connection terminal holder in an electrically insulated state is constituted by the connection terminal body and a cap put on the said connection terminal body with a gas passing hole between the cap and the heating element, and a connection terminal inside hollow portion is formed between the cap and the connection terminal body, and the connection terminal inside hollow portion communicates with the said first inside hollow portion to which a gas supply introduction system for introducing gas is connected.

In any one of the preferred embodiments described above, the connection terminal inside hollow portion communicates with the space in the processing container through the gas passing hole.

Therefore, the gas or the mixed gas (purge gas) introduced into the, first inside hollow portion of each connection terminal holder from the gas introduction system is introduced into the processing container through the connection terminal inside hollow portion and the gas passing hole.

Thereby, it is possible to prevent the raw material gas such as silane gas or the like or the activated species originated from the raw material gas decomposed and/or activated on the surface of the heating element from entering into the connection terminal inside hollow portion. That is, it is possible to effectively prevent the raw material gas or the like from contacting a portion of the heating element where temperature is slightly low (connection region of the heating element). Further, also when the deposited film is removed (the cleaning process is performed), it is possible to prevent the cleaning gas from entering into the connection terminal inside hollow portion. That is, it is possible to effectively prevent the gas or the like from contacting the portion of the heating element where temperature is slightly low (connection region of the heating element).

In other words, thereby, it is possible to prevent the portion of the heating element where temperature is slightly low (connection region of the heating element to the connection terminal) from being degraded (changed to a silicide) by the raw material gas when the film is formed and from reacting with (being etched by) the cleaning gas when the deposited film is removed (the cleaning process is performed).

Here, the above-described cylindrical body, plate, and cap are arranged without contacting the heating element and the heating element is supported only by the connection terminal. Further, gas other than the raw material gas or the cleaning gas is flowed to eliminate the effect of reverse diffusion of the raw material gas. For this reason, it is possible to prevent the heating element in its entirety from being degraded by the raw material gas and to realize a stable film forming environment when the film is formed, and to prevent the heating element from reacting with the cleaning gas when the deposited film is removed (the cleaning process is formed).

As a result, the life of the heating element is elongated to reduce the downtime of production, caused by maintenance, so that productivity can be improved.

In this connection, in the above preferred embodiment, the cap may have a cylindrical body or a plate that mounted on the said cap and covers the connection region of the heating element to the connection terminal without contacting the heating element, and is made of a insulating material or a metal or a composite material of these materials. This can induce the working and effect produced by the configuration in which the connection region of the heating element to the connection terminal is covered with the cap that is mounted on the connection terminal body in such a way as to form the connection terminal inside hollow portion between the cap and the connection terminal body and to produce the gap (for example, gas passing hole) between the cap and the heating element. Further, in addition, this can produce the same working and effect produced by the above-described configuration that enables the gas or the mixed gas introduced into the first inside hollow portion of the connection terminal holder to be introduced into the processing container through the connection terminal inside hollow portion, which communicates with the first inside hollow portion, and the gas passing hole. Further, this can produce the working and effect produced by the configuration in which the cylindrical body or plate for covering the connection region of the heating element to the connection terminal without contacting the heating element is mounted on the said cap. That is, these effects are overlapped. Therefore, it is possible to further effectively to prevent the portion of the heating element where temperature is slightly low (connection region of the heating element to the connection terminal) from being degraded (changed to a silicide) by the raw material gas when the film is formed, and from being etched by the reaction with the cleaning gas when the deposited film is removed (the cleaning process is performed).

In this respect, in the above-described preferred embodiment, the gas introduced toward the processing container from the side of the connection terminal, that is, the gas introduced into the first inside hollow portion of the above-described respective connection terminal holders may be any one gas of hydrogen, argon, helium, neon, krypton, xenon, nitrogen, or ammonia, or a mixed gas of two or more kinds of these gases.

In the heating element CVD system in accordance with the present invention described above, a connection part between the connection terminal and the power supply mechanism, or a connection part between the connection terminal and the power supply mechanism and a wiring part for electrically connecting the connection terminals may be built in the connection terminal holder.

To be more specific, each connection terminal holder may have the first inside hollow portion, and a connection part between the connection terminal and the power supply mechanism, or a connection part between the connection terminal and the power supply mechanism and a wiring part for electrically connecting the connection terminals may be arranged in the said first inside hollow portion.

This can prevent the connection part between the connection terminal and the power supply mechanism, or the connection part between the connection terminal and the power supply mechanism and the wiring part for electrically connecting the connection terminals from being exposed to the space in the processing container. Therefore, this can prevent the possibility that these parts are degraded by the raw material gas, the species decomposed and/or activated on the surface of the heating element, originated from the raw material gas, or the cleaning gas.

Further, in the heating element CVD system in accordance with the present invention, each connection terminal holder may communicate with the space in the processing container only through a plurality of gas blowing holes made in the surface on the side in face with the substrate holder, and may have the second inside hollow portion connected to the raw material gas supply system.

Thereby, the raw material gas is supplied from the raw material gas supply system to the processing container by introducing the raw material gas firstly into the second inside hollow portion, and then introducing into the processing container through the plurality of gas blowing holes.

Further, the cleaning gas is also supplied to the processing container by introducing the cleaning gas firstly into the second inside hollow portion, and then introducing into the processing container through the plurality of gas blowing holes.

In this manner, the plurality of gas blowing holes for introducing the raw material gas and the like into the processing container and the heating elements form an integrated structure by the respective connection terminal holders. This eliminates the need for the support member 31 used in the conventional heating element CVD system shown in FIG. 10 and FIG. 11. The support member 31 for supporting the heating element is the part on which the film might be deposited. Thus, the elimination of the support member 31 can simplify a film forming region around the heating element and can form a film in a uniform thickness and further improve productivity even when a large-area substrate is processed.

When a film is formed, a raw material gas is introduced into the second inside hollow portions of the respective connection terminal holders, and when a cleaning process is performed, a cleaning gas is introduced into the second inside hollow portions of the respective connection terminal holders. According to the above-described structure, the first inside hollow portion is separated from the second inside hollow portion, so that the portions where the connection terminals are connected to the power supply mechanism and the connection wiring between the connection terminals are not exposed to the raw material gas and the cleaning gas in the structure.

That is, by adopting the above-mentioned structure, it is possible to prevent a connection part between the connection terminal and the power supply mechanism, or a connection part between the connection terminal and the power supply mechanism and a wiring part for electrically connecting a connection terminals from being degraded by the raw material gas existing in the space in the processing container, and further to prevent these portions, in the each respective connection terminal holders, from contacting the raw material gas and the cleaning gas, supplied to each connection terminal holder in the respective connection terminal holders and introduced into the processing container through the plurality of gas blowing holes Still further, in the above-described heating element CVD system in accordance with the present invention, each connection terminal holder may hold a plurality of heating elements such that they are in face with the substrate holder, and the gap between at least one or more heating element of the plurality of heating elements and the connection terminal holder may be different from the gap between the other heating element and the connection terminal holder.

In this manner, it is possible to adjust the distance between the heating element and the connection terminal holder by which the said heating element is supported. That is, it is possible to adjust the distance or the gap between the substrate on which the film is to be deposited and the heating element.

Still further, each connection terminal holder may hold a plurality of heating elements such that they are in face with the substrate holder, and the distances between the neighboring heating elements of the plurality of heating elements may be different from each other in part.

In this manner, it is possible to adjust distances, so that the distances between the neighboring heating elements among the plurality of heating elements supported by the connection terminal holders may be set as wide in part, and be narrow in the other part.

Thus, as described above, it is possible to form a thin film having a uniform thickness effectively by adjusting the gap between the heating element at any position among the plurality of heating elements supported by the connection terminal holders, and the connection terminal holder, or by adjusting the distance between the neighboring heating elements among the plurality of heating elements supported by the connection terminal holders, in addition to arranging the connection terminals appropriately at desirable positions, in accordance with the area of substrate to be processed and the process conditions.

In particular, in the case where a plurality of connection terminal holders are disposed to form a film on a large-area substrate, by making the gap between the heating element and the connection terminal holder at the boundary position of the neighboring connection terminal holders which are opposed to each other across a boundary between the neighboring connection terminal holders and the gap between the heating element and the connection terminal holder which are arranged at the positions corresponding to the outer peripheral portion of the large-area substrate different from the gap between the heating element and the connection terminal holder which are arranged at the other positions, it is possible to make the film thickness uniform effectively even though the plurality of connection terminal holders are arranged.

In this connection, in the above-described heating element CVD system in accordance with the present invention, each connection terminal holder may hold a plurality of heating elements such that they are in face with the substrate holder, and the gap between at least one or more heating element of the plurality of heating elements and the connection terminal holder may be different from the gap between the other heating element and the connection terminal holder, and the distances between the neighboring heating elements of the plurality of heating elements may be different from each other in part. In this manner, it is possible to form a film having a uniform thickness effectively over a large area.

BEST MODE FOR CARRYING OUT THE INVENTION

Preferred embodiments of the present invention will hereinafter be described on the basis of the accompanying drawings.

Figure 1:
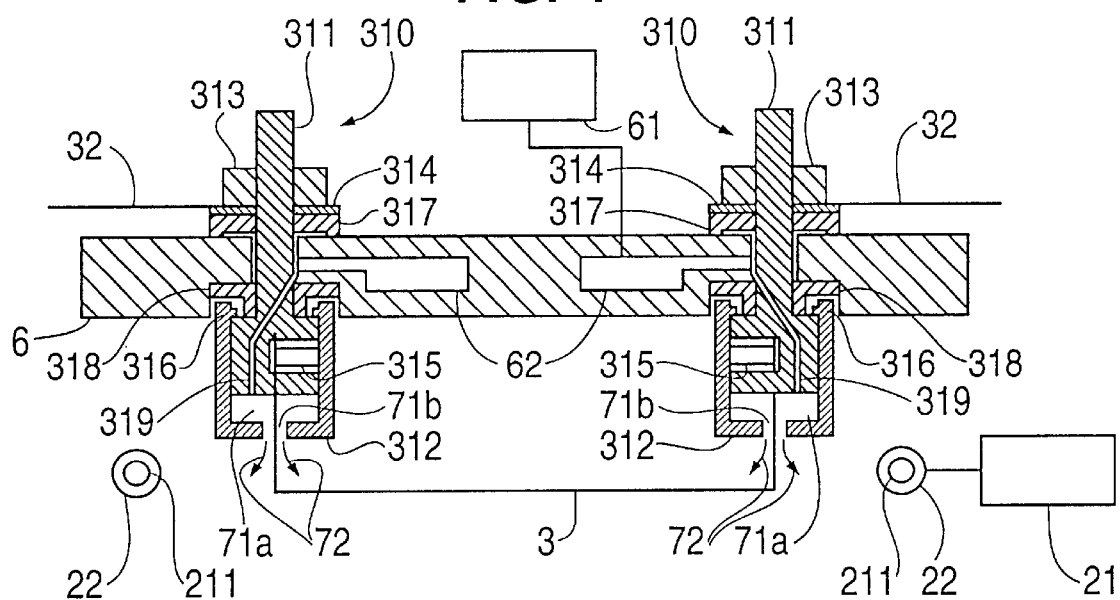
FIG. 1 is a conceptional view showing an example of cross-sectional constitution of connection region between a heating element and a connection terminal of a heating element CVD system in one preferred embodiment of the present invention.
Figure 2:
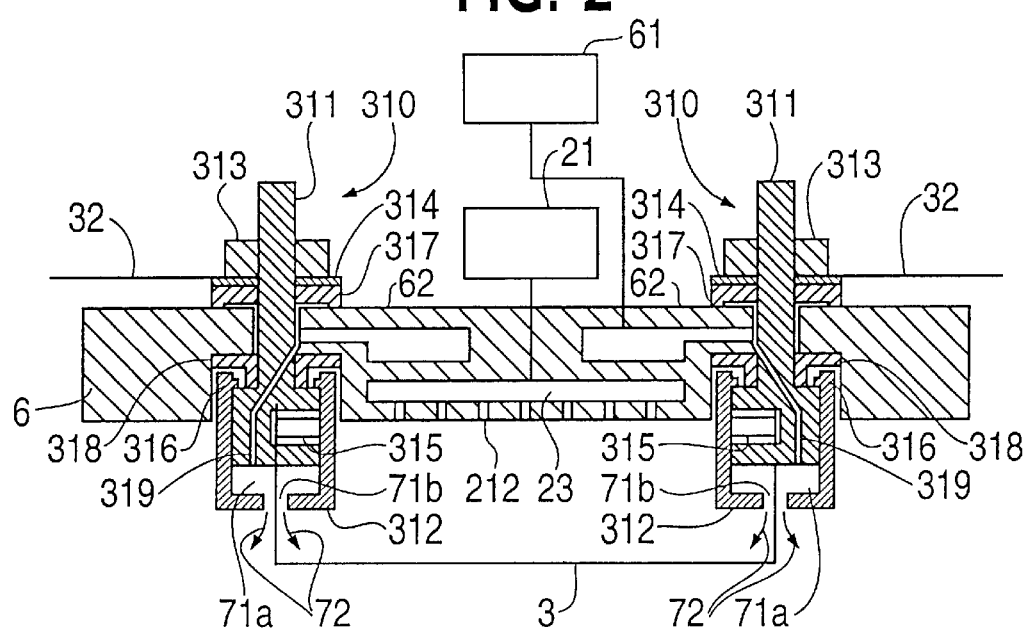
FIG. 2 is a conceptional view showing a cross-sectional constitution of main portion of a connection region between a heating element and a connection terminal of a heating element CVD system in another preferred embodiment of the present invention.

FIG. 1 and FIG. 2 show a cross-sectional structure of a connection part between a heating element and a power supply mechanism in a preferred embodiment of a heating element CVD system in accordance with the present invention.

Figure 10:
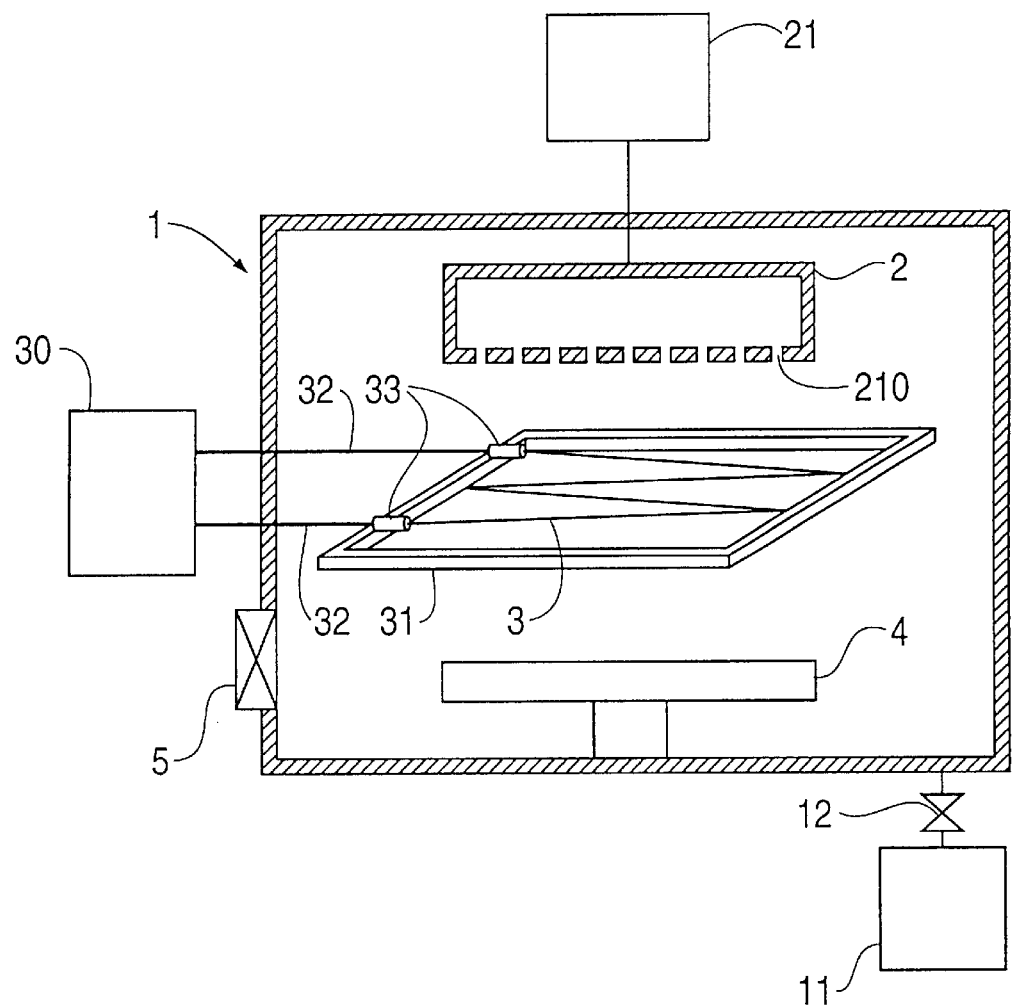
FIG. 10 is a conceptional view showing a constitution of a heating element of a conventional heating element CVD system.

The structures of a processing container 1, a substrate holder 4, and an evacuation system 11 in a heating element CVD system in accordance with the present invention are the same as those of a conventional heating element CVD system shown in FIG. 10, and hence are omitted in the drawings. Further, like reference numerals are attached to members similar to the members shown in FIG. 10.

In the embodiments shown in FIG. 1 and FIG. 2, a connection terminal 310, which is the connection part between a heating element 3 and a power supply mechanism 30, is constituted as follows.

A connection terminal body 311 is held by a connection terminal holder 6 having a first inside hollow portion 62 therein electrically insulated by insulating bodies 317, 318.

The end part of a power supply line 32 from the power supply mechanism 30 and the end part of the heating element 3 are connected to each other via the connection terminal body 311. In the present embodiment, they are connected to each other in the following manner. That is, the end part of the power supply line 32 is connected to the connection terminal body 311 by fixing the connection terminal body 311 to the connection terminal holder 6 by means of a nut 313 with a washer 314 therebetween. And the end part of the heating element 3 is connected to the connection terminal body 311 by pressing the end part of the heating element 3 onto the connection terminal body 311 by means of a heating element pressing spring 315.

Further, a cap 312 is put on the connection terminal body 311 with a connection terminal inside hollow portion 71a existing between the cap 312 and the connection terminal body 311 on the side where the end part of the heating element 3 is connected to the connection terminal body 311 and without contacting the heating element 3. That is, the cap 312 is put on the connection terminal body 311 with a gas passing hole 71b as a gap between itself and the heating element 3.

In the embodiments shown in FIG. 1 and FIG. 2, the upper part of cap 312 is fixed to the connection terminal body 311 with a C-ring 316 interposed therebetween.

Figure 3:
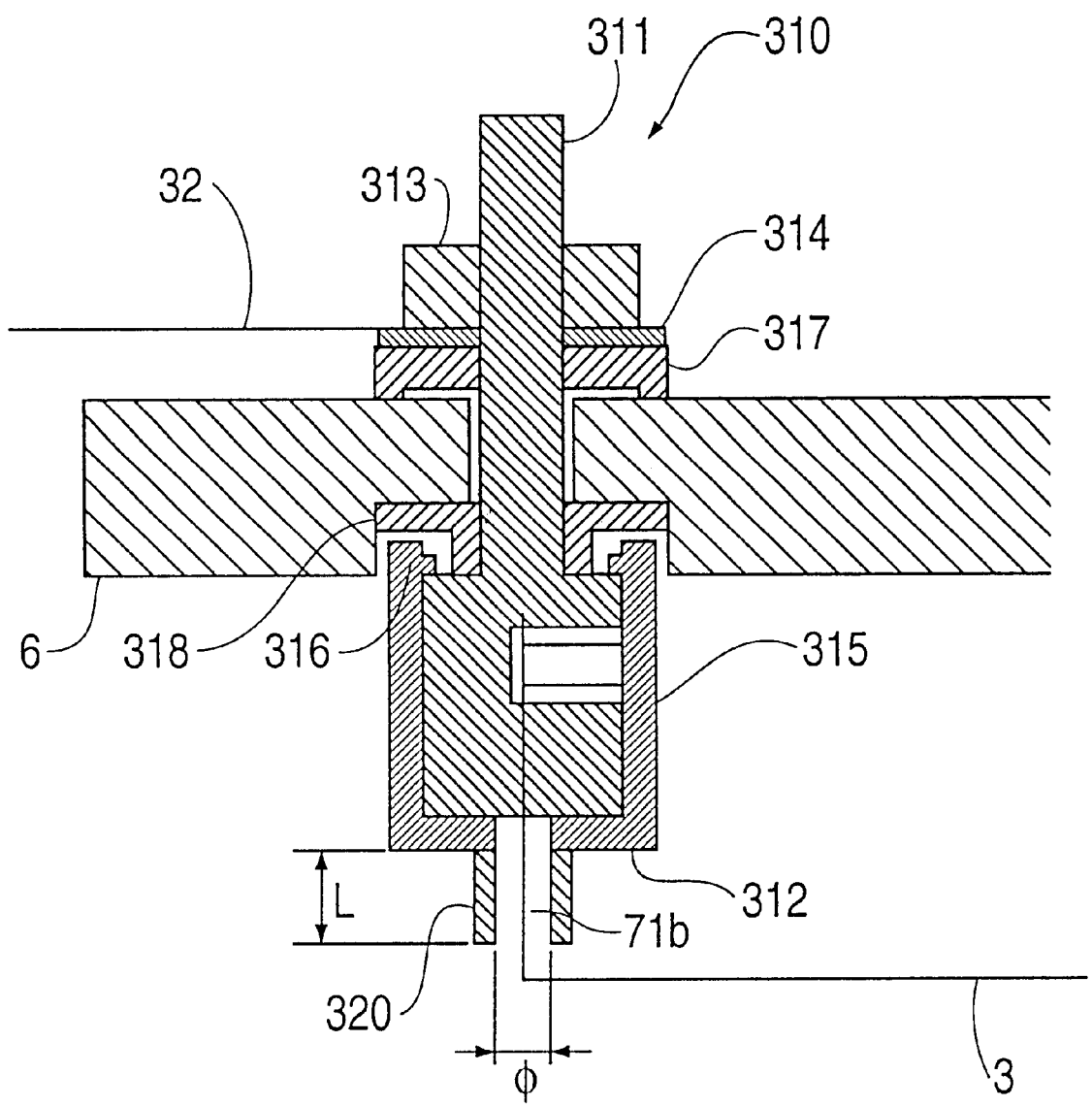
FIG. 3 is a conceptional view showing a cross-sectional constitution of a connection region of a heating element connected to a connection terminal in a heating element CVD system in a preferred embodiment of the present invention.
Figure 4:
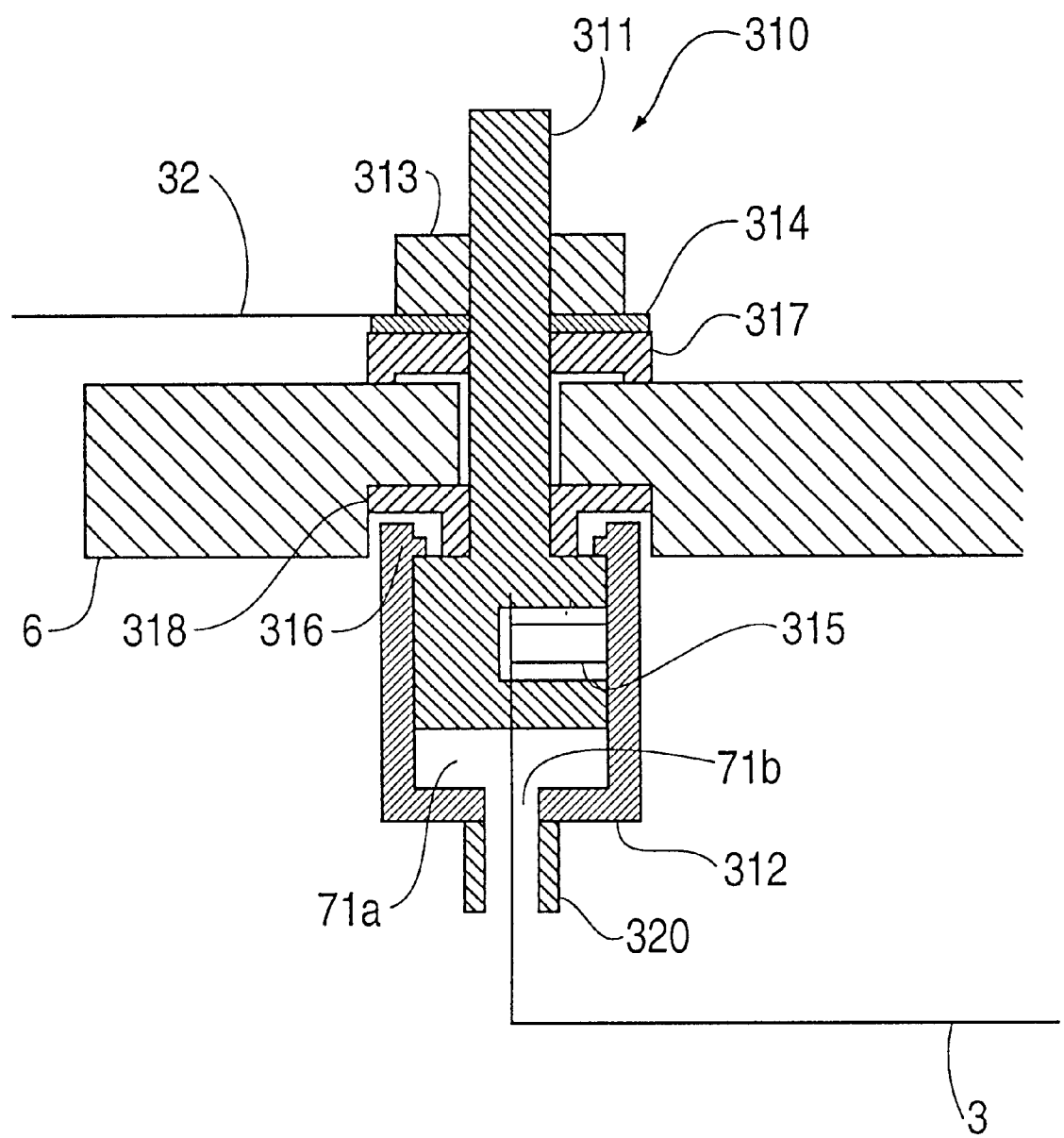
FIG. 4 is a conceptional view showing a cross-sectional constitution of a connection region of a heating element connected to a connection terminal in a heating element CVD system in another preferred embodiment of the present invention.
Figure 5:
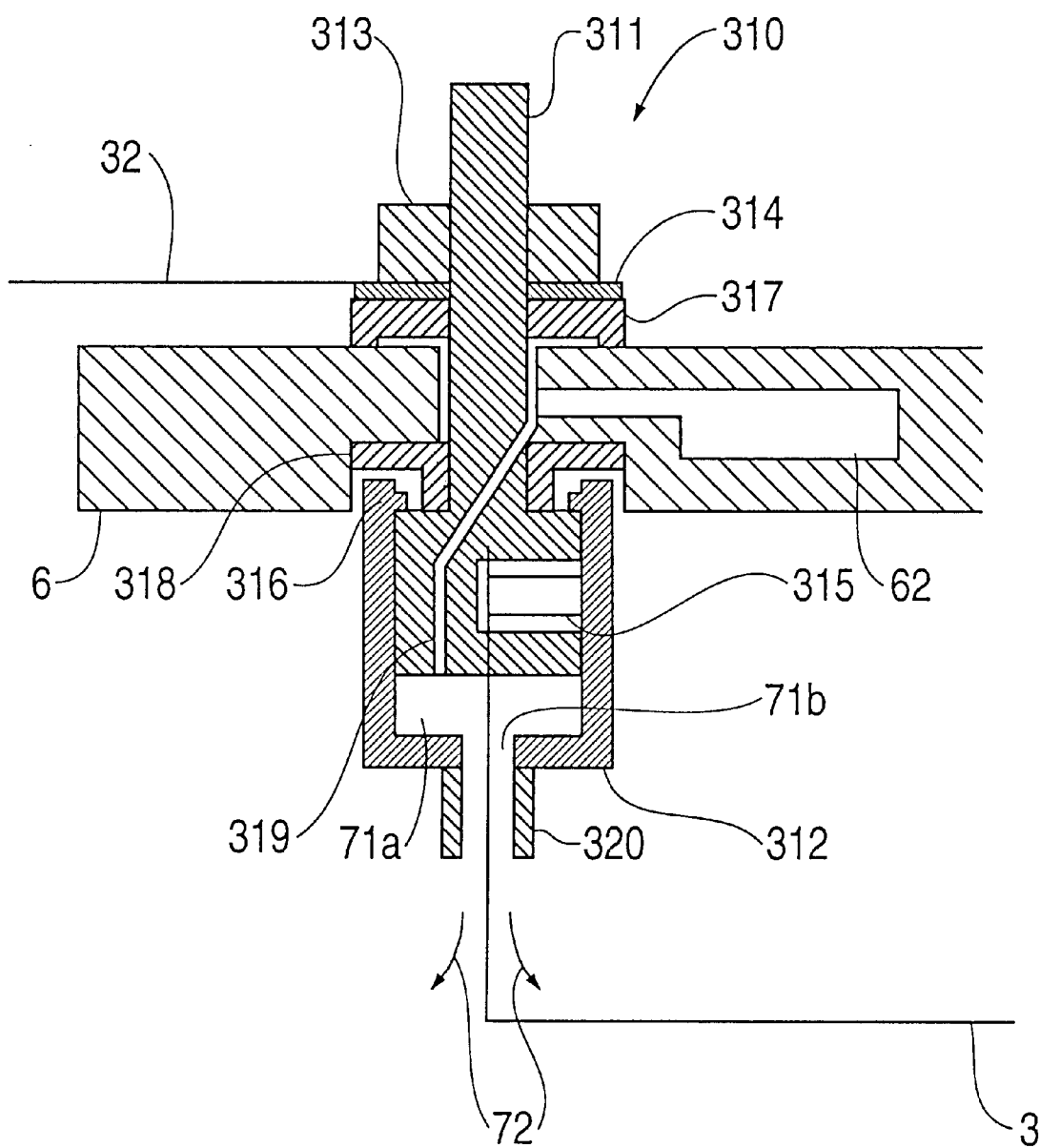
FIG. 5 is a conceptional view showing a cross-sectional constitution of a connection region of a heating element connected to a connection terminal in a heating element CVD system in still another preferred embodiment of with the present invention.

By turning the cap 312 by 180 degrees, a heating element pressing spring 315 can be pressed or loosened. In this manner, pressing the end part of the heating element 3 onto the connection terminal body 311 by the heating element pressing spring 315, when the end part of the heating element 3 is connected to the connection terminal body 311, is adjusted, and loosening the heating element pressing spring 315, when the end portion of the heating element 3 is disconnected and dismounted from the connection terminal body 311, is adjusted, and thus the heating element 3 can be easily mounted onto or dismounted from the connection terminal 310. FIG. 3, FIG. 4, and FIG. 5 show other embodiments in accordance with the present invention. In these embodiments, only the connection terminal 310 is different from the connection terminals 310 in the embodiments shown in FIG. 1 and FIG. 2, so that in FIG. 3, FIG. 4, and FIG. 5, only the connection terminal 310 is shown in an enlarged view.

The embodiments in FIG. 1 to FIG. 5 are common in that the connection region of the heating element 3 to the connection terminal body 311 is not exposed to a space in the processing container 1. In the embodiments shown in FIG. 3 to FIG. 5, however, a cylindrical body 320 is provided on the cap 312 at the side of the inner space of the processing container 1, which is different from the connection terminal 310 in the embodiments shown in FIG. 1 and FIG. 2. In the embodiment shown in FIG. 5, a cylindrical body 320 is provided on the cap 312 directed to the side of the inner space of the processing container 1, which is only different from the connection terminal 310 in the embodiments shown in FIG. 1 and FIG. 2. The embodiment shown in FIG. 4 is different in that it does not have a structure in which a gas passing hole 71b between the heating element 3 and the cap 312 does not communicate with the inside of a connection terminal holder 6. The embodiment shown in FIG. 3 is different in that the gas passing hole 71b between the heating element 3 and the cap 312 does not communicate with the inside of the connection terminal holder 6 and in that a gap (connection terminal inside hollow portion 71a) is not provided between the cap 312 and the connection terminal body 311.

In any one of the embodiments shown in FIG. 1 to FIG. 5, the connection region of the heating element 3 to the connection terminal body 311 is not exposed to the space in the processing container 1. For this reason, it is possible to prevent a raw material gas such as a silane gas or the like from contacting the connection region (a part of heating element 3 where the temperature is slightly low) of the heating element 3 connected to the connection terminal body 311, when the film is formed.

In the embodiments shown in FIG. 1, FIG. 2, and FIG. 5, gas can be passed, by a gas flow passage 319, through the connection terminal inside hollow portion 71a existing between the cap 312 and the connection terminal body 311 and the first inside hollow portion 62 in the connection terminal holder 6. Further, there is provided a gas introduction system 61 for introducing gas into the first inside hollow portion 62 in the connection terminal holder 6.

In the embodiments shown in FIG. 1, FIG. 27 and FIG. 5, the gas passage 319 is drawn at the side of a portion where the heating element 3 is connected to the connection terminal body 311, but it is possible to face the gas passage 319 to the portion where the heating element 3 is just connected to the connection terminal body 311.

The gas introduction system 61 is a gas introduction system for introducing any one gas of hydrogen, argon, helium, neon, krypton, xenon, nitrogen, or ammonia, or a mixed gas containing two or more kinds of these gases. This gas supply system has the same constitution as the raw material gas introduction system 21 shown in FIG. 10.

In the embodiments shown in FIG. 1, FIG. 2, and FIG. 5, as described above, the gas (purge gas) introduced by the gas introduction system 61 is introduced into the processing container 1 through the connection terminal inside hollow portion 71a and the gas passing hole 71b. Accordingly, it is possible to further effectively prevent the raw material gas such as a silane gas or the like from contacting the connection region of the heating element 3 (the part of the heating element 3 where the temperature is slightly low) connected to the connection terminal body 311, when the film is formed. Further, in these embodiments, it is possible to prevent the cleaning gas from contacting the connection region of the heating element 3 (the part of the heating element 3 where the temperature is slightly low) connected to the connection terminal body 311, when the deposited film is removed (a cleaning operation is performed).

In this connection, while only one heating element 3 is shown in the embodiment shown in FIG. 1, the number of the heating elements is arbitrarily selected and, needless to say, the connection terminal holder 6 is provided with the connection terminals 310 of the number corresponding to the number of the heating elements 3.

Further, in FIG. 1, the raw material gas supply system 21, described in the conventional heating element CVD system shown in FIG. 10, is connected to the raw material gas supply unit 22 having blowing-out openings 211 for supplying the raw material gas into the processing container 1, and the raw material gas supply unit 22 is disposed such that it surrounds the heating element 3.

In this connection, in the case where a plurality of heating elements 3 are used, the raw material gas supply unit 22 may be arranged such that it surrounds all the heating elements 3, but in order to form a uniform film, it is desirable to arrange the raw material gas supply units 22 so that the raw material gas supply units 22 surround each heating element 3.

The embodiment shown in FIG. 2 is different from the embodiment shown in FIG. 1 in that the connection terminal holder 6 has the second inside hollow portion 23. A gas supply system 21 is connected to the second inside hollow portion 23. And the second inside hollow portion 23 has a plurality of blowing-out openings 212 made in the surface on the side in face with the substrate holder 4. The second inside hollow portion 23 communicates with the space in the processing container 1 only through the gas blowing-out openings 212. That is, as shown in FIG. 2, the first inside hollow portion 62 is separated from the second inside hollow portion 23.

The other parts in the embodiment shown in FIG. 2 are the same as those in the embodiment shown in FIG. 1, so the same reference numerals are attached to the members similar to the members shown in FIG. 1 and FIG. 10.

While only one heating element 3 is shown in the embodiment shown in FIG. 2, the number of the heating elements 3 is arbitrarily selected and, needless to say, the connection terminal holder 6 is provided with the connection terminals 310 of the number corresponding to the number of the heating elements 3.

In the embodiment shown in FIG. 2, the raw material gas is supplied into the processing container 1 through the blowing-out openings 212 from the second inside hollow portion 23. Therefore, even if a substrate to be processed has a large area, by enlarging the connection terminal holder 6 and increasing the number of the heating elements 3, the raw material gas can be supplied to the whole surface of the large-area substrate, whereby a uniform film can be formed. That is, this embodiment can easily be applied to a substrate having a large area.

When a silicon film is formed by the conventional heating element CVD system shown in FIG. 10, a silane gas and a hydrogen gas are introduced into the processing container 1 from the respective raw material gas supply systems 21 (only one system is shown in FIG. 10) via the gas supply unit 2.

In contrast to this, in the present invention, preferably, the respective gases can be introduced into the processing container 1 as follows. That is, in the case of the embodiment shown in FIG. 1, only the silane gas can be introduced into the processing container 1 from the raw material gas supply system 21 through the blowing-out openings 211 via the raw material gas supply unit 22. The hydrogen gas can be introduced into the processing container 1, as shown by an arrow 72, from the gas supply system 61 through the first inside hollow portion 62 of the connection terminal holder 6, the gas flow passage 319, the connection terminal inside hollow portion 71a, and the gas passing hole 71b. In the case of the embodiment shown in FIG. 2, the silane gas can be introduced into the processing container 1 through the blowing-out openings 212 from the second inside hollow portion 23 of the connection terminal holder 6, and the hydrogen gas can be introduced into the processing container 1, as shown by an arrow 72, from the gas supply system 61 through the first inside hollow portion 62 of the connection terminal holder 6, the gas flow passage 319, the connection terminal inside hollow portion 71a, and the gas passing hole 71b.

This flow of the hydrogen gas can prevent the silane gas, introduced into the processing container 1 from the raw material gas supply unit 22, and/or the activated species originated from the silane gas, which are decomposed and/or activated on the surface of the heating element 3, from entering into the connection terminal inside hollow portion 71a between the cap 312 and the connection terminal body 311. This can prevent the silane gas and/or activated species originated from the silane gas from contacting the connection terminal body 311 of the heating element 3, whereby the portion, where its temperature is slightly low, can be prevented from being changed to a silicide and degraded. In this respect, the embodiment shown in FIG. 5, in which the cylindrical body 320 is provided on the cap 312 directed to the side of the inner space of the processing container 1, can further effectively enhance such effect.

Here, the gas, which is introduced into the connection terminal inside hollow portion 71a between the cap 312 and the connection terminal body 311 from the gas supply system 61 through the first inside hollow portion 62 of the connection terminal holder 6 and the gas flow passage 319, is not limited to the hydrogen gas, but may be any one gas of argon, helium, neon, krypton, or xenon, or a mixed gas of two or more kinds of these gases. The use of any gas or mixed gas of this kinds can prevent the deterioration of the heating element 3 in the same way.

However, even in this case, because the introduction of the hydrogen gas is necessary to polycrystallize the silicon film and to improve the efficiency of the polycrystallization of the silicon film. Therefore, the hydrogen gas may be mixed with any one of the above-mentioned gas other than the hydrogen gas and be introduced into the processing container 1 through the first inside hollow portion 62 of the connection terminal holder 6, the gas flow passage 319, the connection terminal inside hollow portion 71a, and the gas passing hole 71b, as shown by an arrow 72, or from the raw material gas supply unit 22 through the blowing-off openings 211 (in the case of the embodiment shown in FIG. 1), or from the second inside hollow portion 23 of the connection terminal holder 6 through the blowing-off openings 212 (in the case of the embodiment shown in FIG. 2). However, preferably, it is recommended that the hydrogen gas is introduced in the mixed state through the connection terminal 310 because this is more effective.

Further, in the formation of a silicon nitride film, it is absolutely necessary to introduce a silane gas and an ammonia gas for effectively forming a silicon nitride film. Hence, in the formation of the silicon nitride film by means of the conventional heating element CVD system shown in FIG. 10, the silane gas and the ammonia gas are introduced into the processing container 1 from the respective raw material gas supply systems 21 (only one system is shown in FIG. 10) via the gas supply unit 2.

In contrast to this, in the present invention, preferably, only the silane gas is introduced into the processing container 1 from the raw material gas supply system 21, in the case of the embodiment shown in FIG. 1, through the blowing-out openings 211 from the raw material gas supply unit 22. The ammonia gas can be introduced into the processing container 1 from the gas supply system 61 via the first inside hollow portion 62 of the connection terminal holder 6, the gas flow passage 319, the connection terminal inside hollow portion 71a, and the gas passing hole 71b, as shown by an arrow 72. In the case of the embodiment shown in FIG. 2, the silane gas is introduced into the processing container 1 through the blowing-out openings 212 from the second inside hollow portion 23 of the connection terminal holder 6. The ammonia gas can be introduced into the processing container 1 from the gas supply system 61 via the first inside hollow portion 62 of the connection terminal holder 6, the gas flow passage 319, the connection terminal inside hollow portion 71a, and the gas passing hole 71b, as shown by an arrow 72.

As is the above-mentioned case of the formation of the silicon film, this can prevent the silane gas, introduced into the processing container 1 from the raw material gas supply unit 22, and/or the activated species originated from the silane gas, which are decomposed and/or activated on the surface of the heating element 3, from entering into the connection terminal inside hollow portion 71a between the cap 312 and the connection terminal body 311. This can prevent the silane gas and/or activated species originated from the silane gas from contacting the connection terminal body 311 of heating element 3, whereby a portion, where its temperature becomes slightly slow, can be prevented from being changed to silicide and degraded. The embodiment shown in FIG. 5, in which the cylindrical body 320 is provided on the cap 312 directed to the side of the inner space of the processing container 1 can further effectively produce such effect.

Here, in place of the ammonia gas, the mixed gas of ammonia gas and any one gas of hydrogen, argon, helium, neon, krypton, or xenon, or a mixed gas of two or more kinds of these gases may be used. If these gases are used, they can prevent the deterioration of the heating element 3 in the same way.

However, even in this case, the introduction of the ammonia gas is necessary because of the reason described above. Thus, the ammonia gas may be mixed with any one of the above-mentioned gases other than the ammonia gas and be introduced into the processing container 1 through the first inside hollow portion 62 of the connection terminal holder 6, the gas flow passage 319, the connection terminal inside hollow portion 71a, and the gas passing hole 71b, as shown by an arrow 72, or from the raw material gas supply unit 22 through the blowing-off openings 211 (in the case of the embodiment shown in FIG. 1), or from the second inside hollow portion 23 of the connection terminal holder 6 through the blowing-off openings 212 (in the case of the embodiment shown in FIG. 2). However, preferably, it is recommended that the ammonia gas is introduced in the mixed state through the connection terminal 310 because this is more effective.

In the embodiment in accordance with the present invention, when a film deposited on the inside of the processing container 1 is removed (cleaned), each cleaning gas is introduced as follows.

In the case of the embodiment shown in FIG. 1, the cleaning gas is introduced into the processing container 1 from a cleaning gas supply system (not shown), the construction of it is similar to the raw material gas supply system 21, through the blowing-out openings 211 from the raw material gas supply unit 22, and any one gas of hydrogen, argon, helium, neon, krypton, xenon, nitrogen, or ammonia, or a mixed gas of two or more kinds of these gases is introduced into the processing container 1 from the gas supply system 61 through the first inside hollow portion 62 of the connection terminal holder 6, the gas flow passage 319, the connection terminal inside hollow portion 71a, and the gas passing hole 71b, as shown by an arrow 72. In the case of the embodiment shown in FIG. 2, the cleaning gas is introduced into the processing container 1 through the blowing-out openings 212 from the second inside hollow portion 23 of the connection terminal holder 6, and any one gas of hydrogen, argon, helium, neon, krypton, xenon, nitrogen, or ammonia, or a mixed gas of two or more kinds of these gases is introduced into the processing container 1 from the gas supply system 61 via the first inside hollow portion 62 of the connection terminal holder 6, the gas flow passage 319, the connection terminal inside hollow portion 71a, and the gas passing hole 71b, as shown by an arrow 72.

This can prevent the cleaning gas itself and/or the activated species originated from the cleaning gas, which are decomposed and/or activated on the surface of the heating element 3, from entering into the connection terminal inside hollow portion 71a between the cap 312 and the connection terminal body 311. This can prevent the portion of the heating element 3 (connection region connected to the connection terminal body 311) where its temperature is slightly slow from being etched and degraded. Here, the embodiment shown in FIG. 5, in which the cylindrical body 320 is provided on the cap 312 directed to the side of the inner space of the processing container 1 can further effectively produce such effect.

In the cases of the embodiments shown in FIG. 3, FIG. 4, and FIG. 5, the cylindrical body 320 provided on the cap 312 directed to the side of the inner space of the processing container 1 is formed of, for example, alumina and, for example, in an inside diameter φ of 3 mm and a length L of 20 mm.

Figure 6:
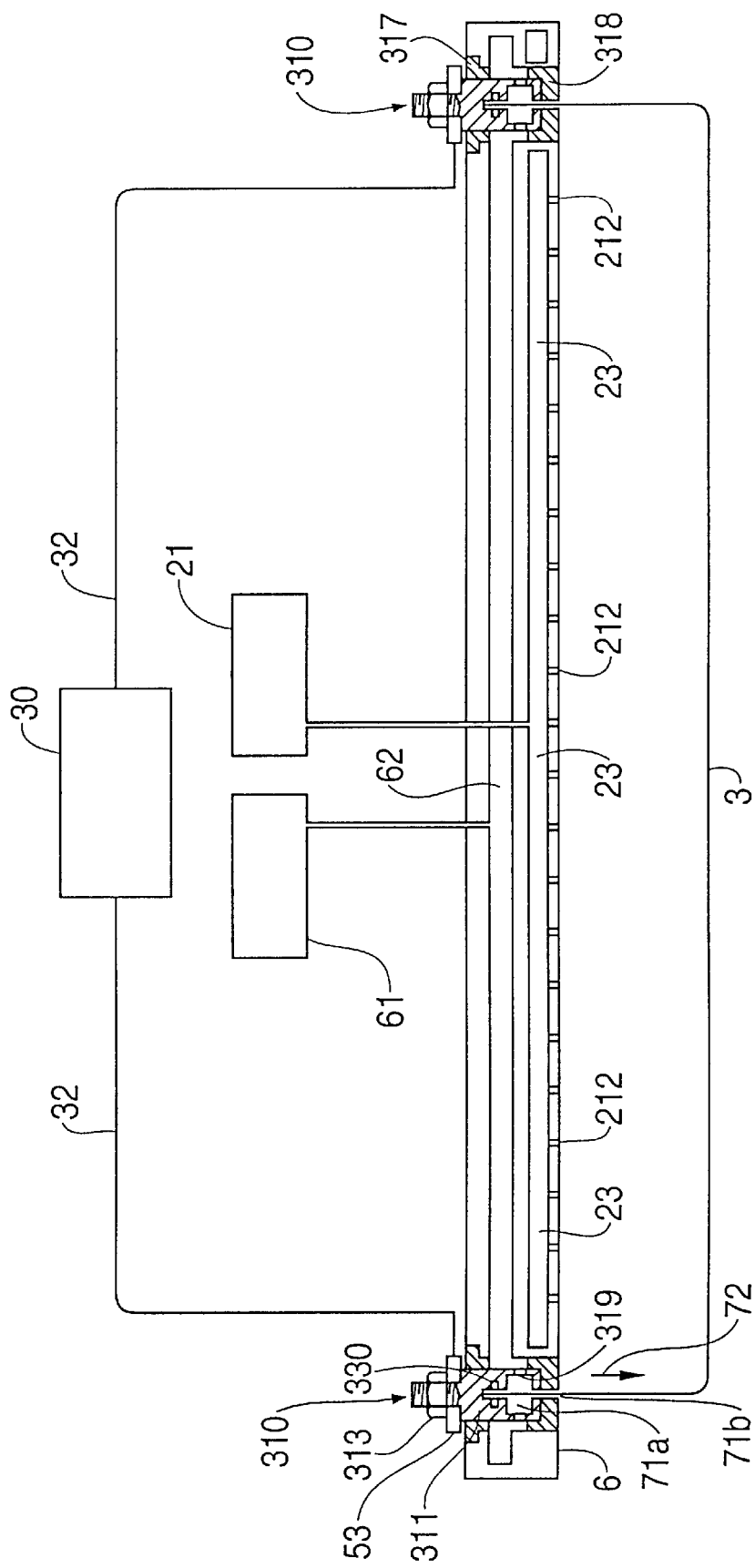
FIG. 6 is a conceptional view showing a cross-sectional constitution of the connection region of a heating element connected to a connection terminal in a preferred embodiment of a heating element CVD system in accordance with the present invention in which one connection terminal holder is disposed in a processing container.

In the embodiment shown in FIG. 6, when a silicon film was formed with the temperature of the heating element 3 at 1800° C. in the state where the introducing operation of the hydrogen gas or the like into the processing container 1 from the inside of the connection terminal holder 6 though the connection terminal inside hollow portion 71a, the gas passing hole 71b, and the hollow portion of the cylindrical body 320, as shown by the arrow 72, was stopped, the connection region of the heating element 3 to the connection terminal body 311 was not changed to silicide. Further, in the embodiments shown in FIG. 3 and FIG. 4, when a silicon film was formed with the temperature of the heating element 3 at 1800° C. in the state where the introducing operation of the hydrogen gas or the like into the processing container 1 from the inside of the connection terminal holder 6 though the gas passing hole 71b and the hollow portion of the cylindrical body 320, as shown by the arrow 72, was stopped, the connection region of the heating element 3 to the connection terminal body 311 was not changed to silicide.

In the embodiment shown in FIG. 5, as described in the embodiments shown in FIG. 1 and FIG. 2, the hydrogen gas or the like can be introduced into the processing container 1, as shown by the arrow 72, from the inside of the connection terminal holder 6 through the gas passing hole 71b and the hollow portion of the cylindrical body 320. Hence, the introduction of this purge gas can further effectively prevent the connection region of the heating element 3 to the connection terminal body 311 from being changed to silicide when the film is formed and from being etched by the reaction with the cleaning gas when the deposited film is removed (cleaned).

In the embodiments shown in FIG. 4 and FIG. 5, a structure has been shown in which the cylindrical body 320 is mounted on the cap 312 directed to the side of the inner space of the processing container 1 but, needless to say, even a structure in which the cylindrical body 320 is mounted toward the inside of the cap 312 (on the side opposite to the substrate holder) can produce the same working and effect.

Further, in the above-described embodiments in accordance with the present invention, a structure has been shown in which the cap 312 is mounted on the connection terminal body 311 singly or in the state where the cylindrical body 320 is mounted on the cap 312, but a structure in which the cap 312 is mounted on the connection terminal holder 6 may be used and can produce the same working and effect. However, such structure has the possibility that if the cap and the cylindrical body are made of a metallic material, the heating element 3 is put into contact with the cap and the cylindrical body by thermal strain or the like to develop an electric short circuit. Therefore, it is preferable that the cap and the cylindrical body are formed of an insulating material such as alumina or the like or a composite material made of a metallic material covered with the insulating material such as alumina or the like.

FIG. 6 shows a cross-sectional structure in which one connection terminal holder 6 described above is disposed in the processing container 1. As shown in FIG. 6, the connection terminal holder 6 holds the connection terminal 310 for electrically connecting the power supply mechanism 30 to the heating element 3 while electrically insulating it by means of insulating members 317, 318. The connection terminal holder 6 holds the heating element 3 in face with the substrate holder 4 and is a structure independent of the processing container 1. The connection terminal holder 6 is connected to the power supply mechanism 30, the raw material gas supply system 21, and the gas introduction system 61.

The structure shown in FIG. 6 is different from those in the embodiments shown in FIG. 1 to FIG. 5 in that a power supply plate 53 connected to the power supply line 32 is sandwiched between a nut 313 and the connection terminal body 311, but the basic structure of the other portion is the same as those of the embodiments shown in FIG. 1 to FIG. 5. Thus, the same reference characters are attached to the members similar to the members described in the embodiments in FIG. 1 to FIG. 5 and their description will be omitted.

Figure 7:
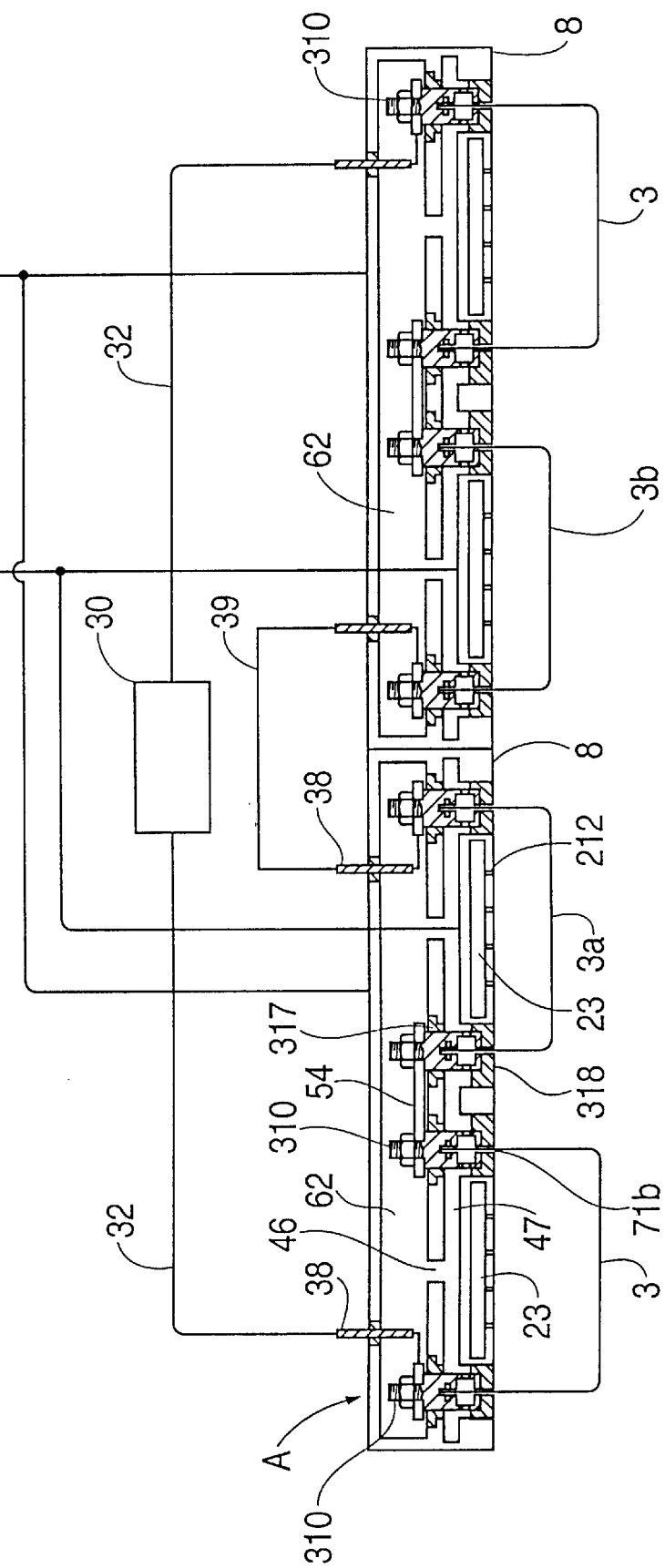
FIG. 7 is a conceptional view showing a cross-sectional constitution of the connection region of a heating element connected to a connection terminal in a preferred embodiment of a heating element CVD system in accordance with the present invention in which two connection terminal holders are disposed in a processing container.
Figure 8:
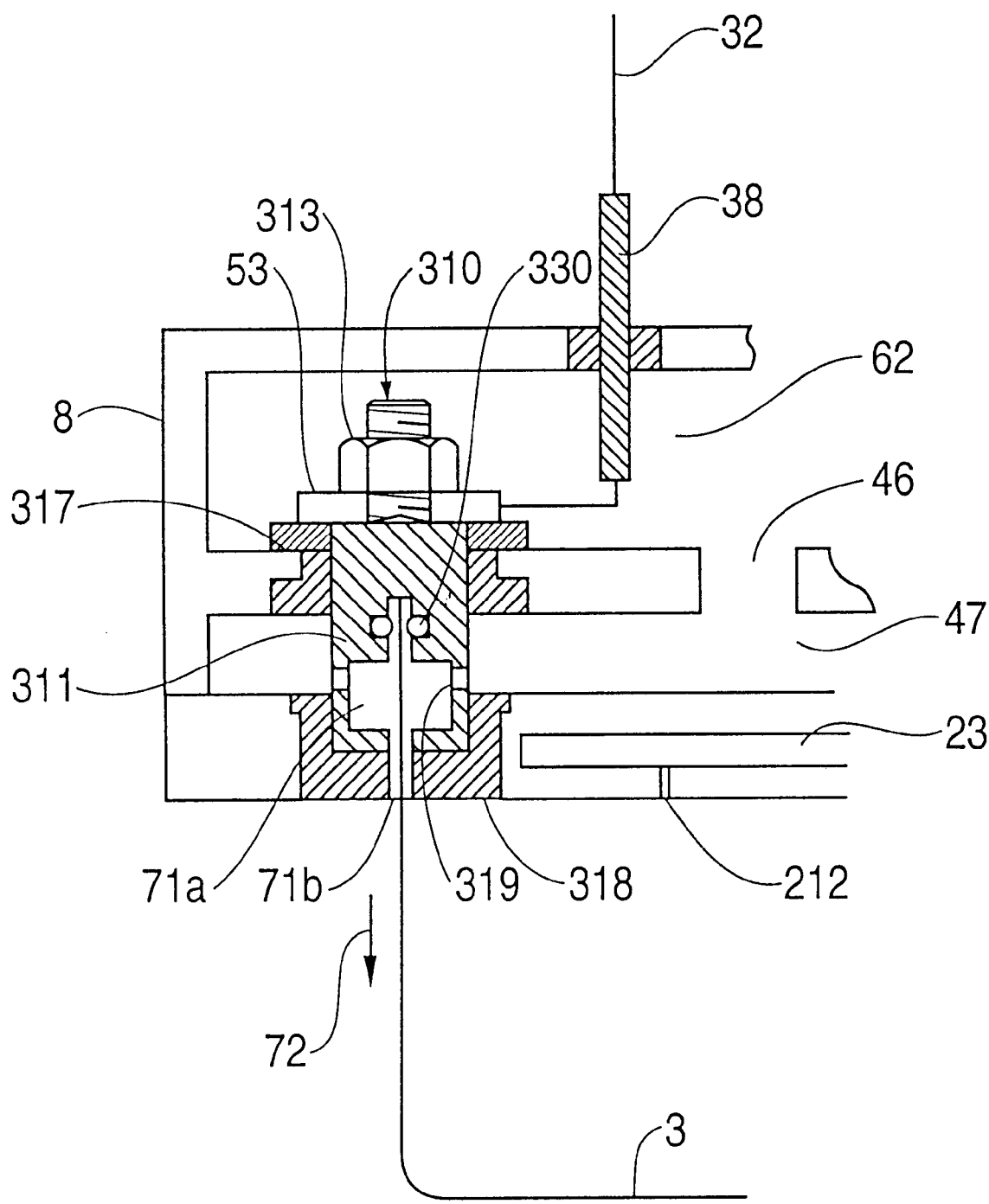
FIG. 8 is a detailed conceptional view of a connection terminal part A in FIG. 7.
Figure 11:
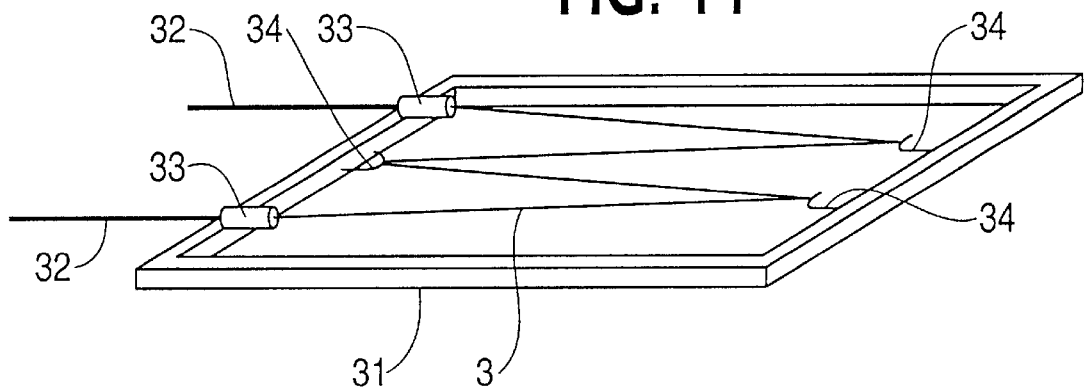
FIG. 11 is a conceptional view showing a constitution of a part of a heating element of another constitution of a heating element of a conventional heating element CVD system.

The heating element CVD system in accordance with the present invention may be constituted in a structure in which a plurality of connection holders 6 described in FIG. 1 to FIG. 6 are disposed in the processing container 1. FIG. 7 and FIG. 8 show a cross-sectional structure of the connection part of a heating element and a power supply mechanism in the case that a plurality of connection holders 6 are used. The part shown in FIG. 7 and FIG. 8 corresponds to the part shown in FIG. 6. FIG. 8 shows the part A in FIG. 7 in detail. As is the case of FIG. 1 to FIG. 6, the structures of the processing container 1, the substrate holder 4 and the exhaust system, etc. are the same as in the conventional heating element CVD system shown in FIG. 10, and FIG. 11 described above, so the illustration and description will be omitted.

Further, the embodiment shown in FIG. 7 and FIG. 8 is different from the embodiment shown in FIG. 6 in that the nut 313 has an object of fixing the connection terminal body 311 to the connection terminal holder 8 and, at the same time, of connecting the power supply plates 53, 54 to the connection terminal body 311. However, the other basic structure and configuration are the same as in the embodiments shown in FIG. 1 to FIG. 6. Therefore, the same reference characters are attached to the members similar to members shown in FIG. 1 to FIG. 6 and the description will be omitted.

In the embodiments shown in FIG. 6 to FIG. 8, the heating element 3 is connected to and held by the connection terminal body 311 by a coil spring 330 which is different from the heating element pressing spring 315 in the embodiments shown in FIG. 1 to FIG. 5. This can mount or dismount the heating element 3 on or from the connection terminal body 311 with a single motion without the turning operation of the cap 312 in the embodiments shown in FIG. 1 to FIG. 5.

The embodiment shown in FIG. 7 is different from the embodiment shown in FIG. 6 in that two connection terminal holders 8 are disposed in the processing container 1 and that the connection part of the connection terminal and the power supply mechanism and the wiring part for electrically connecting the connection terminals are built in the connection terminal holder 8. Then, the difference in a structure between the embodiment shown in FIG. 7 and the embodiment shown in FIG. 6 will be described specifically in the following.

In the embodiment shown in FIG. 7 and FIG. 8, the connection part of the connection terminal 310 and the power supply mechanism 30 is covered with the first inside hollow portion 62. This can prevent the connection part of the connection terminal 310 and the power supply mechanism 30 from being exposed to the space in the processing container 1. Further, also the power supply plate 54 (between the connection terminals) that is the wiring part for electrically connecting the connection terminals is covered with the first inside hollow portion 62, thereby is prevented from being exposed to the space in the processing container 1.

In this connection, in the embodiments shown in FIG. 7 and FIG. 8, the connection terminal body 311 is provided with a gas flow passage 319 for connecting the inside hollow portion 47 in the connection terminal holder 8 to the connection terminal inside hollow portion 71a. Thus, the gas introduced from the gas introduction system 61 fills the first inside hollow portion 62 and is introduced into the next inside hollow portion 47 through an inside space through hole 46. The gas is further flowed into the connection terminal inside hollow portion 71a in the connection terminal body 311 through the gas flow passage 319. Then, the gas passes near the heating element 3 and the coil spring 330 to the non-contact part between the heating element 3 connected to the connection terminal 310 and the connection terminal holder 8 That is, the gas flows to the space in the processing container 1 through the gas passing hole 71b, as shown by the arrow 72.

In the heating element CVD system shown in FIG. 7 and FIG. 8, in the connection terminal holder 8, the second inside hollow portion 23 into which the raw material gas or the cleaning gas is introduced is separated from the first inside hollow portion 62. The connection terminal 310 and the power supply plates 53, 54 are disposed in the first inside hollow portion 62 that is separated from the second inside hollow portion. Further, as described above, the gas introduced from the gas introduction system 61 flows from the first inside hollow portion 62 to the gas passing hole 71b. So that, the connection terminal 310 and the power supply plates 53, 54 are not affected by the raw material gas and the cleaning gas. As described above, the connection terminal 310 and the power supply plates 53, 54 are not exposed to the space in the processing container 1. Therefore, these members are not degraded by activated species originated from the raw material gas (silane gas) by being decomposed and/or activated on the surface of the heating element 3.

Further, in the heating element CVD system shown in FIG. 7 and FIG. 8, there are provided a plurality of connection terminal holders 8 that are independent in a structure of each other. For this reason, even if a film is formed on a large-area substrate of a size of over 1 m, it is not necessary to manufacture one large connection terminal holder having an area equal to or larger than the area of the substrate. That is, it is recommended that a plurality of connection terminal holders 8 which are similar to each other but independent of each other may be manufactured and disposed according to the area of a substrate to be processed. Therefore, it is possible to provide a heating element CVD system for forming a film on a large-area substrate at low cost and easily.

This will be described with reference to FIG. 9(a), (b).

Figure 9A:
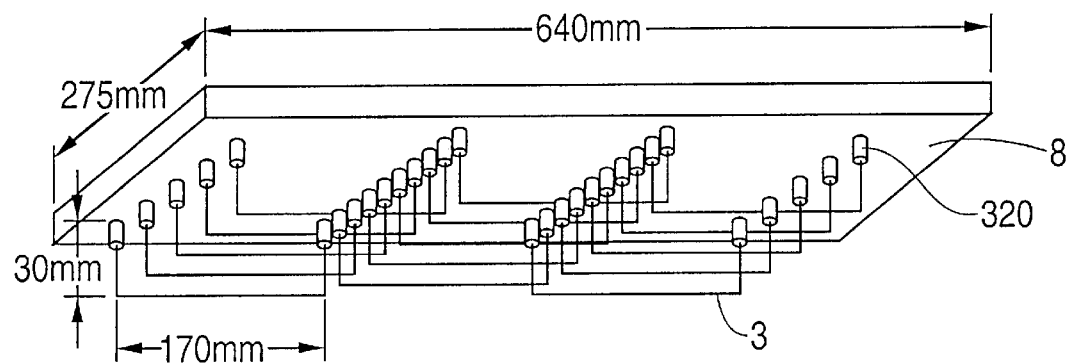
FIG. 9(a) is a schematic view of a connection terminal holder when viewed from the surface to which a heating element is attached.

FIG. 9(a) is a schematic view of the connection terminal holder 8 when viewed from the side to which the heating element 3 is mounted. The connection regions of the heating elements 3 connected to the connection terminals 310 are covered with the cylindrical bodies 320. In the example of FIG. 9(a), the connection terminal holder 8 has a size of 275 mm in length×640 mm in width. A single heating element 3 is 170 mm in length. Five heating elements 3 are arranged in parallel in the longitudinal direction and three groups of five heating elements 3 are arranged in the lateral direction, so fifteen heating elements 3 are supported by the connection terminal holder 8

Figure 9B:
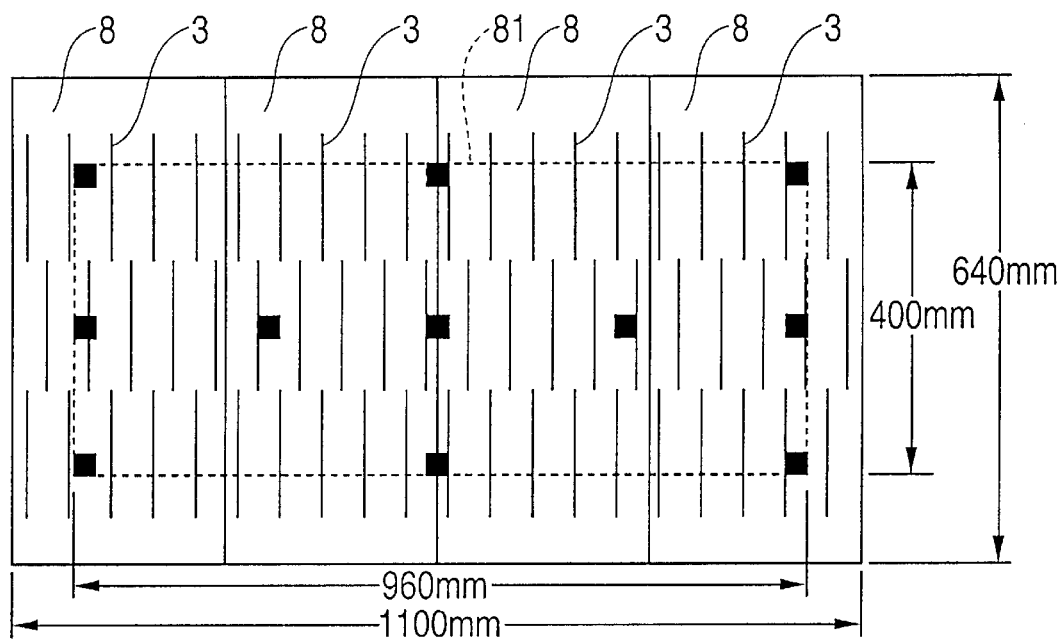
FIG. 9(b) is a schematic plane view of a connection terminal holder as to the case when a plurality of connection terminals are disposed to form a film on a large-area substrate.

FIG. 9(b) is a schematic plane view of the connection terminal holders 8 and showing the embodiment where a plurality of connection terminal holders 8 are arranged in order to be applied to form a large-area substrate. The size of the substrate is 400 mm in length and 960 mm in width (shown with a dotted line denoted by a reference number 81). In this case, four connection terminal holders 8 shown in FIG. 9(a) are arranged in parallel. This corresponds, as a whole, to one connection terminal holder of a size of 640 mm in length and 1100 mm in width.

According to the heating element CVD system of the present invention, as shown in FIG. 9(b), by arranging the plurality of connection terminal holders 8, even when a film is to be formed on a large-area substrate of a size of over 1 m, it is not necessary to manufacture a large connection terminal holder having a large area equal to or larger than the area of the substrate.

The embodiment shown in FIG. 7 shows a cross-sectional view of the heating element CVD system provided with two connection terminal holders 8. According to the heating element CVD system of the present invention, it is recommended that a plurality of connection terminal holders 8 may be arranged in accordance with the size of a substrate on which a film is to be formed. For this reason, the connection terminal holder 8, which is one independent structure, can be formed in a size easily processed and thus can be manufactured at low cost and easily. Further, the weight of one connection terminal holder 8 is also reduced. Therefore, the connection terminal holder 8 can be easily mounted on the processing container (vacuum container) 1 when it is manufactured and maintained. Still further, an opening for putting the connection terminal holder 8 into the processing container 1 can be reduced in size, whereby the manufacturing cost of the processing container 1 can be reduced.

In the heating element CVD system in accordance with the present invention, the distance between the heating elements 3 mounted on the connection terminal holder 6 or 8 and/or the gap between the connection terminal holder 6 or 8 and the heating element 3 (30 mm in the example shown in FIG. 9(a)) can be changed. The distance can be changed by changing the position where the connection terminal 310 is mounted on the connection terminal holder 6 or 8. Further, as shown in FIG. 7, the gap can be changed by changing the shape or configuration of the heating element 3 or 3a mounted on the connection terminal 310. In this manner, according to the area of the substrate and the process conditions, by adjusting the gap between the connection terminal holder and the heating element, that is, eventually, by adjusting the gap between the substrate and the heating element 3 and/or the distance between the heating elements mounted on the connection terminal holder, it is possible to effectively form a film of a uniform thickness in case of arranging the plurality of connection terminal holders 8.

For example, in the embodiment shown in FIG. 7, the gaps between the heating elements 3a, 3b, and the connection terminal holders 8 at the boundary position of the neighboring connection terminal holders are set to be smaller than the gap between the heating element 3 and the connection terminal holder 8 at a position away from the boundary position of the connection terminal holders. In this manner, by setting the gap between at lest one or more heating element 3 of the plurality of heating elements supported by the connection terminal holder 8 and the connection terminal holder 8 different from the gap between the other heating elements 3 and the connection terminal holder 8, the thickness of the film can be made uniform. That is, by adjusting the gap between the substrate and the heating elements 3, the thickness of the film can be made uniform, for example, in case of arranging the plurality of connection terminal holders 8 or at the outer peripheral portion of the large-area substrate. In particular, by making the gap between the heating elements 3a, 3b and the connection terminal holders at the boundary position of the neighboring connection terminal holders different from the gap between the heating element and the connection terminal holder at the other position, the thickness of the film can be made uniform even if the plurality of connection terminal holders 8 are arranged.

(Example of Test of Film Thickness Distribution)

As shown in FIG. 9(b), a film was formed on a large-area substrate by the use of the heating element CVD system in accordance with the present invention in which four connection terminal holders 8 shown in FIG. 9(a) were arranged with no gap between them and the uniformity of the film thickness was studied.

As shown in FIG. 9(b), the gap between the heating elements 3 was not varied even at the connection portion of the neighboring connection terminal holders 8, whereby the four connecting terminal holders 8 which were arranged adjacently to each other were made to correspond to one connection terminal holder.

A glass substrate 81 of a size of 960 mm×400 mm was arranged on the substrate holder 4 and then a film was formed under the following conditions:

| | |
|---|---|
| Pressure in processing container 1 | 2 Pa |
| Flow rate of $SiH_4$ | 100 ml/min in normal state |
| Flow rate of $H_2$ | 55 ml/min in normal state |
| Temperature of heating element 3 | 1750° C. |
| Distance between heating element and substrate | 45 mm |

The average film forming speed at 11 points, shown by a mark ■, on the glass substrate 81 was 5.3 angstrom/sec (0.53 nm/sec) and its distribution was as comparatively good as ±7.5%

As a result, it was found that even in the case when a film was formed on a large-area substrate of 1 m in length, a uniform film thickness distribution of ±10 or less could be ensured by the use of the heating element CVD system of the embodiment shown in FIG. 7 and FIG. 8 in which a plurality of independent connection terminal holders 8 are arranged in parallel, thereby being made to correspond to one connection terminal holder so as to be applied to the formation of the film on the large-area substrate. Further, in this case, it is possible to prevent the film thickness distribution from being made nonuniform form connection terminal holder to connection terminal holder in case of use of plural connection terminal holders or at the outer peripheral portion of the large-area substrate by adjusting the distance between the heating elements 3 mounted on the connection terminal holders 8 and/or by adjusting the gap between the substrate and the heating element 3 by adjusting the gap between the connection terminal holder 8 and the heating elements 3 according to the area of the substrate and the process conditions.

In the heating element CVD system in accordance with the present invention described above, the heating element 3 is connected to the connection terminal body 311 by the heating element pressing spring 315 or by the coil spring 330, as the material of the heating element pressing spring 315 or the coil spring 330, metal such as beryllium copper, stainless steel, or Inconel, or ceramics can be used. Further, the heating element CVD system in accordance with the present invention can be applied even to the cases when any halogen-based cleaning gas such as fluorine ($F_2$), chlorine (Cl$_2$), nitrogen trifluoride (NF$_3$), methane tetrafluoride (CF$_4$), ethane hexafluoride (C$_2$F$_6$), propane octafluoride (C$_3$F$_8$), carbon tetrachloride (CCl$_4$), methane chloride trifluoride (CClF$_3$), ethane chloride pentafluoride (C$_2$ClF$_5$), chlorine trifluoride (ClF$_3$), sulfur hexafluoride (SF$_6$) is used as the cleaning gas when the cleaning process is performed.

While preferred embodiments in accordance with the present invention have been described with reference to the accompanying drawings up to this point, it will be understood that the present invention is not limited to these embodiments. On the contrary, the present invention may be modified further variously within the spirit and scope of the invention as defined by the appended claims.

For example, the formation of the silicon film and the silicon nitride film in the above-described embodiments in accordance with the present invention is the application of the heating element CVD system of the present invention to the formation of the films, and the heating element CVD system of the present invention can be applied also to the formation of the other films. Further, while the silane gas is used in the formation of the film in the above-mentioned embodiments of the present invention, disilane (Si$_2$H$_5$), trisilane (Si$_3$H$_8$), and tetraethoxysilane (TEOS) other than the silane gas can be used also in the application of the present invention.

Further, a method of connecting the heating element 3 to the connection terminal body 311 is not limited to a method in which the heating element pressing spring 315 or the coil spring 330 is used, but a method in which a screw is used may be adopted.

Still further, while a wire-shaped heating element 3 is used in the heating element CVD system in accordance with the present invention, the heating element may be shaped in a foil, and the wire-shaped heating element may be disposed in the shape of a coil or the like. However, in the case when a coil-shaped heating element is used, it is desirable to use a heating element which is shaped in a wire at least at the gap in the connection terminal. This is because it is important to set the gas passing hole 71b between the cap 312 and the heating element 3 narrow so that the gas passing hole 71b can effectively prevent the raw material gas and the activated species thereof or the cleaning gas and the activated species thereof from entering into the connection terminal inside hollow portion 71a in the cap 312, so it is desirable to reduce the area of the gap.

In the embodiment shown in FIG. 6, only the example in which one heating element 3 is mounted on one connection terminal holder 6 is shown. Further, in the embodiment shown in FIG. 7, only the example in which two heating elements 3, 3a or 3, 3b are mounted on one connection terminal holder 8, respectively, is shown. However, the number of heating elements 3 mounted on one connection terminal holder 6 or 8 may be selected arbitrarily. Further, needless to say, connection terminals 310 of the number corresponding to the number of heating elements 3 are held by the connection terminal holder 8.

Further, in the embodiment shown in FIG. 7, the example in which two connection terminal holders 8 are used is shown, but it is natural that the number of connection terminal holders 8 may be increased arbitrarily in accordance with the area of the substrate on which the film is formed.

Further, in the embodiment shown in FIG. 7 and FIG. 8, the gas such as hydrogen introduced into the first inside hollow portion 62 from the gas introduction system 61 is flowed from the first inside hollow portion 62 into the connection terminal inside hollow portion 71a of the connection terminal body 311 through the inside space through hole 46, the inside space 47, the gas flow passage 319 and is introduced into the space in the processing container 1 through the non-contact portion between the heating element 3 connected to the connection terminal 310 and the connection terminal holder 8, that is, the gas passing hole 71b. However, the first inside hollow portion 62 communicating with a path through which the gas such as hydrogen introduced into the connection terminal holder 8 is introduced into the space of the processing container 1 through the gas passing hole 71b may not be constituted, in particular, in a structure in which it separated from the inside space 47 and communicates with the inside space 47 through the inside space through hole 46, but may be constituted in a structure in which it communicates directly with the connection terminal inside hollow space 71a of the connection terminal body 311 through the gas flow passage 319 from the first inside hollow portion 62.

According to the heating element CVD system in accordance with the present invention, the connection region of the heating element connected to the connection terminal is not exposed to the space in the processing container, so that it is possible to prevent the raw material gas such as silane gas or the like from contacting a portion of the heating element where temperature is slightly low (connection region of the heating element) and degrading the said portion (changing the said portion into suicide).

Further, if a configuration is adopted in which the connection region of the heating element connected to the connection terminal is covered with a member in the form in which the said member does not contact the connection region, that is, in such a way that there is a gap between the said member and the connection terminal and that there is a gap between the said member and the heating element, thereby the said connection region of the heating element is prevented from being exposed to the space in the processing container, and a purge gas is flowed through the said gap from the side of connection portion to the processing container, it is possible to prevent the connection region of the heating element where temperature is slightly lower than a predetermined high temperature (that is, the connection region of the heating element where the temperature is lower than about 1600° C. when the film is formed and lower than about 2000° C. when the cleaning process is performed) from being degraded (being changed into silicide) by the raw material gas when the film is formed and, further, from being etched by the reaction with the cleaning gas when the cleaning process is performed.

As a result, it is possible to prevent the heating element from being degraded by the raw material gas when the film is formed and thus to stabilize a film forming environment and further to prevent the heating element from reacting with the cleaning gas when the deposited film is removed. Further, it is possible to reduce the frequency of replacement of the heating element that accompanies the breaking of the vacuum to the atmosphere. These effects can improve productivity.

In this manner, it is possible to provide a heating element CVD system that can elongate the life of the heating element, stabilize the film forming environment, and improve productivity.

Further, it is possible to prevent the connection terminal that is the connection part between the heating element and the power supply mechanism and the connection wiring between the connection terminals from being exposed to the space in the processing container (vacuum chamber) and thus it is possible to select a material suitable for the connection terminal and the connection wiring without worrying that they are being degraded by the activated gas.

Still further, according to the present invention, it is possible to meet with forming of film on a large-area substrate of a size of over 1 m and to provide a heating element CVD system capable of ensuring a uniform film thickness.

According to the present invention, it is possible to provide a heating element CVD system that can elongate the life of a heating element and stabilize a film forming environment and has a high productivity and realize a uniform film thickness even when a film is formed on a large-area substrate.

What is claimed is:

1. A heating element CVD system comprising: a processing container in which a predetermined processing is performed to a substrate held by a substrate holder disposed therein; an evacuation system which is connected to the processing container and evacuates it to a vacuum; a raw material gas supply system for supplying a predetermined raw material gas into the processing container; and a heating element which is disposed in the processing container and is supplied with electric power from a power supply mechanism, thereby being heated to high temperatures, wherein the raw material gas introduced into the processing container from the raw material gas supply system is decomposed and/or activated by the heating element kept at high temperatures to form a thin film on the substrate held by the substrate holder, wherein one or a plurality of connection terminal holders is placed in the processing chamber; each of the said connection terminal holders holds a plurality of connection terminals at a predetermined position with electrically insulating therebetween; each of the said connection terminals connects the heating elements to the power supply mechanism electrically; the said heating elements connected to the connection terminals are supported in face with the substrate holder; and a connection region of the heating element connected to the connection terminal is not exposed to a space in the processing container.

2. A heating element CVD system according to claim 1, wherein the connection region of the heating element connected to the connection terminal is covered with a cylindrical body or a plate that is made of an insulating substance, a metal, or a composite of these materials and covers the connection region with a gap between the cylindrical body or the plate and the heating element.

3. A heating element CVD system according to claim 1, wherein the connection region of the heating element connected to the connection terminal is covered with a cylindrical body or a plate that is made of an insulating substance, a metal, or a composite of these materials and covers the connection region with a connection terminal inside hollow portion between the cylindrical body or the plate and the connection terminal and with a gap between the cylindrical body or the plate and the heating element.

4. A heating element CVD system according to claim 1, wherein the each of connection terminal is constituted by a connection terminal body and a cap put on the connection terminal body with a gap between itself and the heating element, and wherein a connection terminal inside hollow portion is formed between the cap and the connection terminal body.

5. A heating element CVD system according to claim 1, wherein each connection terminal holder has a first inside hollow portion, and wherein the connection region of the heating element connected to each of a plurality of connection terminals held at the predetermined position of the connection terminal holder in the electrically insulated state is covered with a cylindrical body or a plate made of an insulating material or a metal or a composite material of these materials, which covers the connection region with the connection terminal inside hollow portion between the cylindrical body or the plate and the connection terminal and with a gas passing hole between the cylindrical body or the plate and the heating element, and wherein the connection terminal inside hollow portion communicates with the first inside hollow portion to which a gas introduction system for introducing gas is connected.

6. A heating element CVD system according to claim 1, wherein each connection terminal holder has a first inside hollow portion, and wherein each of a plurality of connection terminals held at the predetermined position of the connection terminal holder in the electrically insulated state is constituted by a connection terminal body and a cap put on the connection terminal body with a gas passing hole between the cap and the heating element, and wherein a connection terminal inside hollow portion is formed between the cap and the connection terminal body, and wherein the connection terminal inside hollow portion communicates with the first inside hollow portion to which a gas introduction system for introducing gas is connected.

7. A heating element CVD system according to claim 4, wherein as to the cap, a cylindrical body or a plate that covers the connection region of the heating element connected to the connection terminal without contacting the heating element and that is made of a insulating material or a metal or a composite material of these materials are mounted.

8. A heating element CVD system according to claim 6, wherein as to the cap, a cylindrical body or a plate that covers the connection region of the heating element connected to the connection terminal without contacting the heating element and that is made of a insulating material or a metal or a composite material of these materials are mounted.

9. A heating element CVD system according to claim 5, the gas is any one gas of hydrogen, argon, helium, neon, krypton, xenon, nitrogen, or ammonia, or a mixed gas of two or more kinds of these gases.

10. A heating element CVD system according to claim 6, wherein the gas is any one gas of hydrogen, argon, helium, neon, krypton, xenon, nitrogen, or ammonia, or a mixed gas of two or more kinds of these gases.

11. A heating element CVD system according to claim 7, wherein the gas is any one gas of hydrogen, argon, helium, neon, krypton, xenon, nitrogen, or ammonia, or a mixed gas of two or more kinds of these gases.

12. A heating element CVD system according to claim 8, wherein the gas is any one gas of hydrogen, argon, helium, neon, krypton, xenon, nitrogen, or ammonia, or a mixed gas of two or more kinds of these gases.

13. A heating element CVD system according to claim 1, wherein a connection part between the connection terminal and power supply mechanism, or the connection part between the connection terminal and the power supply mechanism and a wiring part for electrically connecting the connection terminals is built in the connection terminal holder.

14. A heating element CVD system according to claim 5, wherein each connection terminal holder has the first inside hollow portion, and wherein a connection part between the connection terminal and power supply mechanism, or the connection part of the connection terminal and the power supply mechanism and a wiring part for electrically connecting the connection terminals is arranged in the first inside hollow portion.

15. A heating element CVD system according to claim 6, wherein each connection terminal holder has the first inside hollow portion, and wherein a connection part between the connection terminal and power supply mechanism, or the connection part of the connection terminal and the power supply mechanism and a wiring part for electrically connecting the connection terminals is arranged in the first inside hollow portion.

16. A heating element CVD system according to claim 1, wherein each connection terminal holder communicates with a space in the processing container only through a plurality of gas blowing holes made in the surface on the side in face with the substrate holder and has a second inside hollow portion connected to the raw material gas supply system.

17. A heating element CVD system according to claim 1, wherein each connection terminal holder holds a plurality of heating elements in face with the substrate holder, and wherein the gap between at least one or more heating element of the plurality of heating elements and the connection terminal holder is different from the gap between the other heating element and the connection terminal holder.

18. A heating element CVD system according to claim 1, wherein each connection terminal holder holds a plurality of heating elements in face with the substrate holder, and wherein the distances between the neighboring heating elements of the plurality of heating elements are different from each other in part.

19. A heating element CVD system according to claim 1, wherein each connection terminal holder holds a plurality of heating elements in face with the substrate holder, and wherein the gap between at least one or more heating element of the plurality of heating elements and the connection terminal holder is different from the gap between the other heating element and the connection terminal holder, and wherein the distances between the neighboring heating elements of the plurality of heating elements are different from each other in part.

* * * * *